(12) United States Patent
Kim et al.

(10) Patent No.: US 10,279,540 B2
(45) Date of Patent: May 7, 2019

(54) CONTROLLABLE AND REVERSIBLE PH-RESPONSIVE ROLLABLE 2D NANO STRUCTURES

(71) Applicant: Okinawa Institute of Science and Technology School Corporation, Okinawa (JP)

(72) Inventors: Jeong-Hwan Kim, Okinawa (JP); Murtaza Bohra, Okinawa (JP); Vidya Dhar Singh, Okinawa (JP); Antony Douglas Galea, Okinawa (JP); Panagiotis Grammatikopoulos, Okinawa (JP); Mukhles Ibrahim Sowwan, Okinawa (JP)

(73) Assignee: OKINAWA INSTITUTE OF SCIENCE AND TECHNOLOGY SCHOO, Okinawa (JP)

( * ) Notice: Subject to any disclaimer, the term of this patent is extended or adjusted under 35 U.S.C. 154(b) by 289 days.

(21) Appl. No.: 15/120,399

(22) PCT Filed: Feb. 20, 2015

(86) PCT No.: PCT/JP2015/000830
§ 371 (c)(1),
(2) Date: Aug. 19, 2016

(87) PCT Pub. No.: WO2015/125488
PCT Pub. Date: Aug. 27, 2015

(65) Prior Publication Data
US 2017/0066178 A1    Mar. 9, 2017

Related U.S. Application Data

(60) Provisional application No. 61/942,274, filed on Feb. 20, 2014.

(51) Int. Cl.
*B29C 37/00* (2006.01)
*B29C 61/06* (2006.01)
(Continued)

(52) U.S. Cl.
CPC .......... *B29C 61/06* (2013.01); *B29C 37/0025* (2013.01); *C23C 14/00* (2013.01); *B29K 2079/085* (2013.01)

(58) Field of Classification Search
CPC ........................... B29C 61/06; B29C 37/0025
See application file for complete search history.

(56) References Cited

U.S. PATENT DOCUMENTS 6,872,759 B2    3/2005  Suzuki et al.
7,625,404 B2   12/2009  Shahinpoor et al.
(Continued)

FOREIGN PATENT DOCUMENTS

CN    101081313 B    6/2011
CN    103169974 A    6/2013
(Continued)

OTHER PUBLICATIONS

Bay et al.,"A conducting polymer artificial muscle with 12% linear strain", Advanced Materials, Feb. 2003, No. 3, pp. 310-313.
(Continued)

*Primary Examiner* — John J Brayton
(74) *Attorney, Agent, or Firm* — Westerman, Hattori, Daniels & Adrian, LLP

(57) ABSTRACT

A two-dimensional nano-sheet that is foldable in response to a surrounding pH value includes a polyethyleneimine (PEI) chain taking a two-dimensional form; and a plurality of domains made of gold, attached to the PEI chain, the plurality of domains of gold forming a percolating gold film on the PEI chain.

6 Claims, 30 Drawing Sheets

(51) Int. Cl.
    B29K 79/00    (2006.01)
    C23C 14/00    (2006.01)

(56)         References Cited

U.S. PATENT DOCUMENTS

| 7,645,519 | B2 | 1/2010 | Garamszegi et al. |
| 8,100,819 | B2 | 1/2012 | Banik |
| 8,287,991 | B2 | 10/2012 | Donelson et al. |
| 8,535,704 | B2 | 9/2013 | Yang |
| 2005/0175507 | A1* | 8/2005 | Tsukruk ............ B01D 67/0069 422/68.1 |
| 2008/0033073 | A1 | 2/2008 | Sellergren et al. |

FOREIGN PATENT DOCUMENTS

| CN | 103224633 A | 7/2013 |
| JP | 2006-255536 A | 9/2006 |
| WO | 97/27822 A1 | 8/1997 |
| WO | 01/15754 A1 | 3/2001 |

OTHER PUBLICATIONS

Kaneto et al., ""Artificial muscle": Electromechanical actuators using polyaniline films", Synthetic Metals, 1995, 71, pp. 2211-2212.
Moschou et al., "Artificial Muscle Material with Fast Electroactuation under Neutral pH Conditions", Chemical Materials, 2004, vol. 16, No. 12, pp. 2499-2502.
Kim et al., "A novel method of manufacturing three-dimensional ionic polymer-metal composites (IPMCs) biomimetic sensors, actuators and artificial muscles", Polymer, 2002, 43, pp. 797-802.
Gayotin et al., "Artificial muscle project: process development of polydimethyl siloxane thin films for use in dielectric electroactive polymer artificial muscle actuators", Cal. Poly. State Univ.—San Luis Obispo, Jun. 2011.
Chaterji et al., "Smart polymeric gels: Redefining the limits of biomedical devices", Progress in Polymer Science, 32, 2007, pp. 1083-1122.
Vaddiraju et al., "Hierarchical Multifunctional Composites by Conformally Coating Aligned Carbon Nanotube Arrays with Conducting Polymer", Applied Materials and Interfaces, 2009, vol. 1, No. 11, pp. 2565-2572.
Longo et al., "pH-Controlled Nanoaggregation in Amphiphilc Polymer Co-networks", ACS Nano, 2013, vol. 7, No. 3, pp. 2693-2704.
Benight et al., "Stretchable and self-healing polymers and devices for electronic skin", Progress in Polymer Science, 2013, pp. 1-17.
European Search Report dated Sep. 25, 2017, in a counterpart European patent application No. 15751318.5.
Ponnusamy Vinoth Kumar et al., "Rapid microwave assisted synthesis of graphene nanosheets/polyethyleneimine/gold nanoparticle composite and its application to the selective electrochemical determination of dopamine", Talanta, Elsevier, Amsterdam, NL, vol. 120, Dec. 11, 2013 (Dec. 11, 2013), pp. 148-157.
Gaelle Creusat et al., "Proton Sponge Trick for pH-Sensitive Disassembly of Polyethylenimine-Based siRNA Delivery Systems", Bioconjugate Chemistry, vol. 21, No. 5, May 19, 2010 (May 19, 2010), pp. 994-1002.
Chinese Office Action dated May 24, 2017, in a counterpart Chinese patent application No. 201580009590.7.
A. Martien et al. Emerging applications of stimuli-responsive polymer materials. Nat. Mater. 9, 101-113 (2010).
R. Lupitskyy, Y. Roiter, C. Tsitsilianis, S. Minko, From Smart Polymer Molecules to Responsive Nanostructured Surfaces. Langmuir 21, 8591-8593 (2005).
S. T. Milner, Polymer brushes. Science 251, 905-914 (1991).
P. M. Mendes, Stimuli-responsive surfaces for bio-applications. Chem. Soc. Rev. 37, 2512-2529 (2008).
M. R. Aguilar, C. Elvira, A. Gallardo, B. Vasquez, J. S. Roman, 2007. Smart polymers and their applications as biomaterials. In: N. Ashammakhi, R.L. Reis, E Chiellini, (eds.), Topics in Tissue Engineering, V. 3, University of Oulu, Finland, pp. 2-27.
A. Kumar, A. Srivastava, I. Y. Galaev, B. Mattiasson, Smart polymers: physical forms and bioengineering applications. Prog. Polym. Sci. 32, 1205-37 (2007).
H. Meng, H., G. Li, Reversible switching transitions of stimuli-responsive shape changing polymers. J. Mater. Chem. A. 1, 7838-7865 (2013).
C. Sanchez, H. Arribart, M. M. Giraud-Guille, Biomimetism and bioinspiration as tools for the design of innovative materials and systems. Nat. Mater. 4, 277-288 (2005).
K. Liu, Y. Tian, L. Jiang, Bio-inspired superoleophobic and smart materials: Design, fabrication, and application. Prog. Mater. Sci. 58, 503-564 (2013).
K. Liu, L. Jiang, Bio-inspired design of multiscale structures for function integration. Nanotoday 6, 155-175 (2011).
H. D. Espinosa, J. E. Rim, F. Barthelat, M. J. Buehler, Merger of structure and material in nacre and bone-perspectives on de novo biomimetic materials. Progress in Materials Science 54, 1059-1100 (2009).
A. Finnemore, P. Cunha, T. Shean, S. Vignolini, S. Guldin et al., Biomimetic layer-by-layer assembly of artificial nacre. Nat. Commun. 3, 966-972 (2012).
R. I. Close, Dynamic properties of mammalian skeletal muscles. Physiol. Rev., 52, 129-197 (1972).
R. O. Ritchie, M. J. Buehler, P. Hansma, Plasticity and toughness in bone. Phys. Today 62, 41 (2009).
E. Henneman, C. B. Olson, Relations between structure and function in the design of skeletal muscles. J. Neurophysiol. 28, 581-598 (1965).
C. K. Choudhury, S. Roy, Structural and dynamical properties of polyethylenimine in explicit water at different protonation states: a molecular dynamics study. Soft Matter 9, 2269-2281 (2013).
X. Gong, T. Ngai, Interactions between solid surfaces with pre-adsorbed poly (ethylenimine) (PEI) layers: effect of anadsorbed free PEI chains. Langmuir 29, 5974-5981 (2013).
M. Schwartzkopf, A. Buffet, V. Korstgens, E. Metwalli, K. Schlage et al., From atoms to layers: in situ gold cluster growth kinetics during sputter deposition. Nanoscale 5, 5053-5062, (2013).
X. Yu, P. M. Duxbury, G. Jeffers, M. A. Dubson, Coalescence and percolation in thin metal films. Phys. Rev. B 44, 13163-13166 (1991).
R. Songmuang, C. Deneke, O. G. Schmidt, Rolled-up micro-and nanotubes from single-material thin films. Appl. Phys. Lett. 89, 223109-223109 (2006).
X. Li, Strain induced semiconductor nanotubes: from formation process to device applications. J. Phys. D: Appl. Phys. 41, 193001-193013 (2008).
P. Cendula, S. Kiravittaya, I. Mönch, J. Schumann, O. G. Schmidt, Directional roll-up of nanomembranes mediated by wrinkling. Nano Lett. 11, 236-240 (2010).
R. Ma, Y. Bando, T. Sasaki., Directly rolling nanosheets into nanotubes. J. Phys. Chem. B 108, 2115-2119 (2004).
L. M. Viculis, J. J. Mack, R. B. Kaner, A chemical route to carbon nanoscrolls. Science 299, 1361-1361 (2003).
O. G. Schmidt, K. Eberl, Nanotechnology: Thin solid films roll up into nanotubes. Nature 410, 168-168 (2001).
S. T. Milner, T. A. Witten, M. E. Cates, Theory of the grafted polymer brush. Macromolecules 21, 2610-2619 (1988).
S. T. Milner, T. A. Witten, M. E. Cates, Effects of polydispersity in the end-grafted polymer brush. Macromolecules 22, 353-861 (1989).
T. W. Kelley, P. A. Schorr, K. D. Johnson, M. Tirrell, C. D. Frisbie, Direct force measurements at polymer brush surfaces by atomic force microscopy. Macromolecules 31, 4297-4300 (1998).
M. Müller, Phase diagram of a mixed polymer brush. Physical Review E 65, 030802-4 (2002).
J. Siegel, O. Lyutakov, V. Rybka, Z. Kolská, V. Švčík, Properties of gold nanostructures sputtered on glass. Nanoscale Res. Lett. 6, 96 (2011).
M. C. Dixon, T. A. Daniel, M. Hieda, D. M. Smilgies, M. H. Chan et al., Preparation, structure, and optical properties of nanoporous gold thin films. Langmuir 23, 2414-2422 (2007).

(56) References Cited

OTHER PUBLICATIONS

D. F. Evans, G. Pye, R. Bramley, A. G. Clark, T. J. Dyson et al., Measurement of gastrointestinal pH profiles in normal ambulant human subjects. Gut 29, 1035-1041 (1988).

Shameli, K.; Ahmad, M. B.; Al-Mulla, E. J.; Ibrahim, N. A.; Shabanzadeh, P.; Rustaiyan, A.; Abdollahi, Y.; Bagheri, S.; Abdolmohammadi, S.; Usman, M. S., "Green Biosynthesis of Silver Nanoparticles Using Callicarpa maingayi Stem Bark Extraction", Molecules, 2012, 17, 8506.

Kumar, S. K.; R. Krishnamoorti, "Nanocomposites: Structure, Phase Behavior, and Properties", Ann. Rev. Chem. Biomol. Eng., 1, 37, (2010).

Li, S.; Lin, M.-M.; Toprak, M. S.; Kim, D.-K.; Muhammed, M., "Nanocomposites of polymer and inorganic nanoparticles or optical and magnetic applications", Nano Reviews 2010, 1, 5214.

Gao, B.; Rozin, M. J.; Tao, A. R., "Plasmonic nanocomposites: polymer-guided strategies for assembling metal nanoparticles", Nanoscale, 2013, 5, 5677.

Shenhar, R.; Norsten, T. B.; Rotello, R. M., "Polymer-Mediated Nanoparticle Assembly: Structual Control and Applications", Adv. Mat., 2005, 17(6), 657.

Shao X.; Nilius N.; Freund H.-J., "Crossover from two- to three-dimensional gold particle shapes on CaO films of different thicknesses", Phys. Rev. B. 2012, 85, 15444.

Shen, M.; Shi, X., "Synthesis of polyethyleneimine-stabilized gold nanoparticles for colorimetric sensing of heparin", Coll. Surf. A., 419(20), 2013, 80.

Thomas, M.; Klibanov, A. M., "Conjugation to gold nanoparticles enhances polyethylenimine's transfer of plasmid DNA nto mammalian cells", PNAS, 2003, 100(16), 9138.

Song, W. J.; Du, J.-Z.; Sun, T.-M.; Zhang, R-Z.; Wang, J., "Gold Nanoparticles Capped with Polyethyleneimine for Enhanced siRNA Delivery", Small, 2010, 6(2) 239.

Kim, K.; Lee, J. W.; Shin, K. S., "Detection of a few of biogenic volatile organic compounds by means of Raman scattering of isocyanide-adsorbed gold nanostructures", Spectrochim. Acta. A, 2013, 100, 15.

Thompson C. V., "Grain Growth in Thin Films", Ann. Rev. Mater. Sci., 1990, 20, 245.

International Search Report (ISR) issued in PCT/JP2015/000830 dated May 2015.

Written Opinion (PCT/ISA/237) issued in PCT/JP2015/000830 dated May 2015.

Kim, J. -H., Bohra, M., Singh, V., Cassidy, C., Sowwan M., "Smart Composite Nanosheets with Adaptive Optical Properties", ACS Applied Materials & Interfaces, Aug. 27, 2014, vol. 6 No. 16, p. 13339-13343, ISSN 1944-8244.

Choudhury, C. K., Roy, S., "Structural and dynamical properties of polyethylenimine in explicit water at different protonation states: a molecular dynamics study", Soft Matter, Feb. 21, 2013, vol. 9, No. 7, p. 2269-2281, ISSN 1744-683X.

\* cited by examiner

[Fig. 1]
(A) 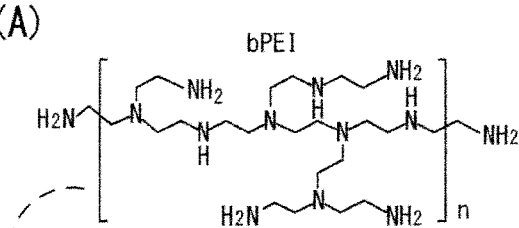
(B)
(C) 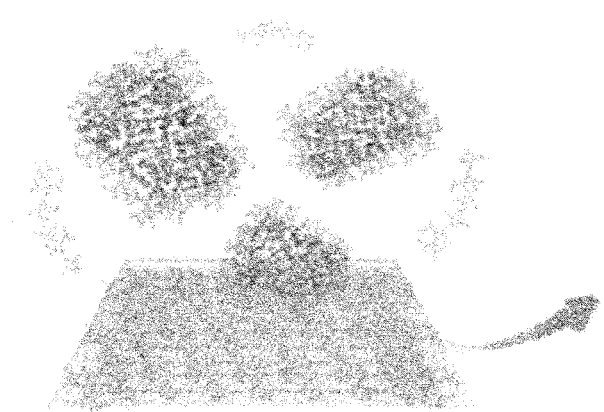
(D) 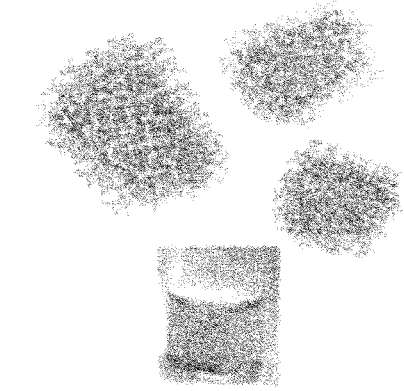

[Fig. 2(A-B)]
(A)
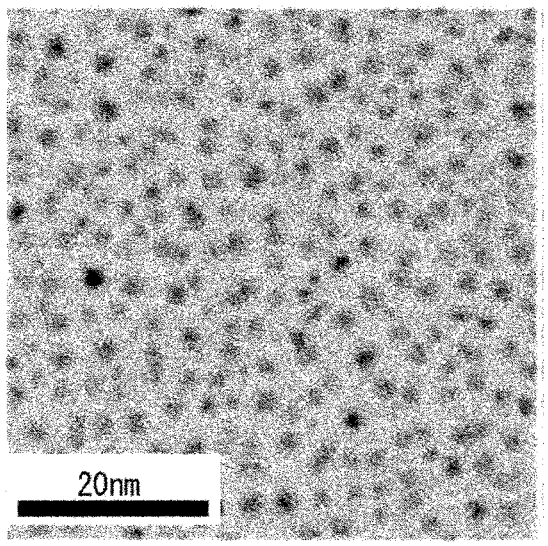
(B)
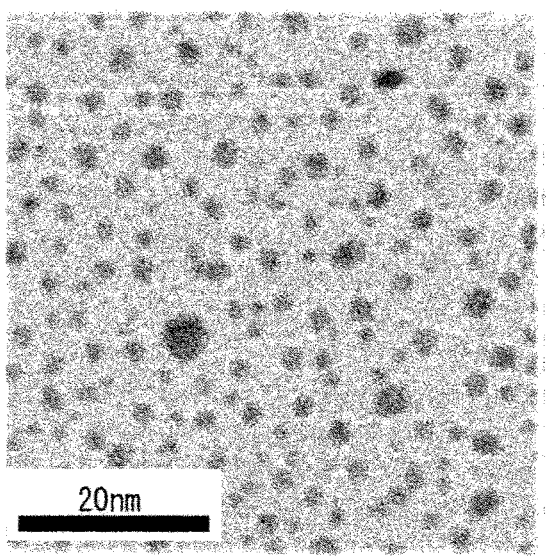

[Fig. 2(C-D)]
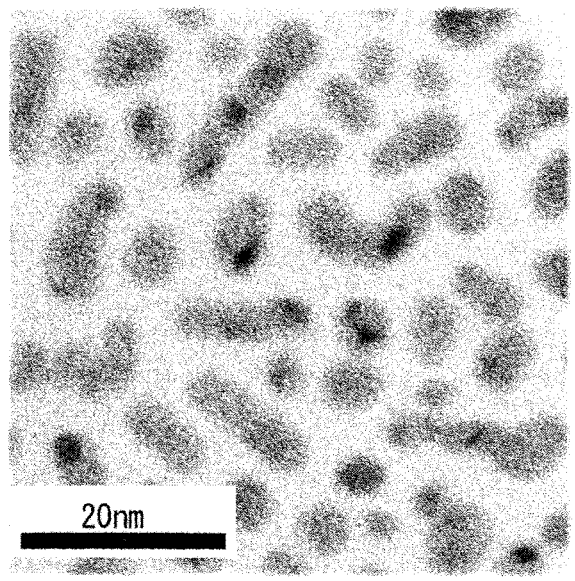
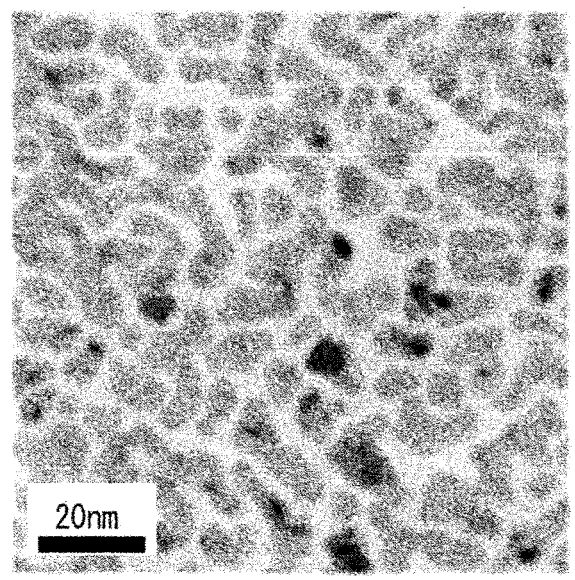

[Fig. 3]
(A)
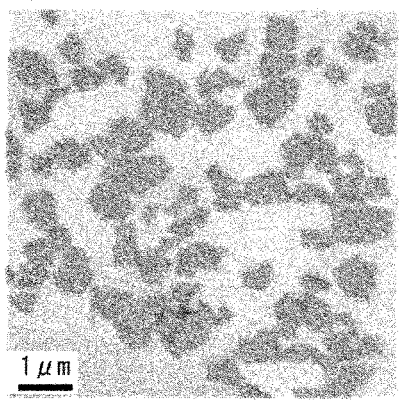
(B)
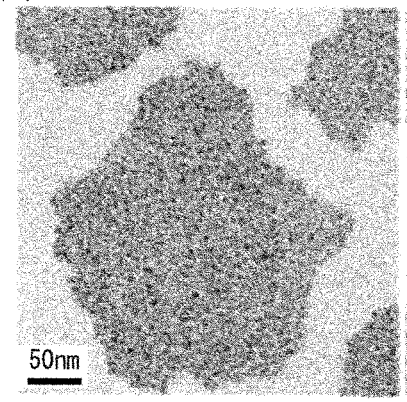
(C)
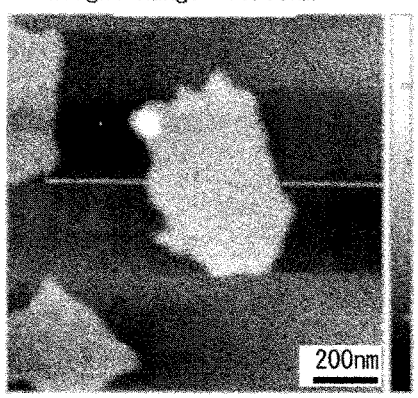
(D)
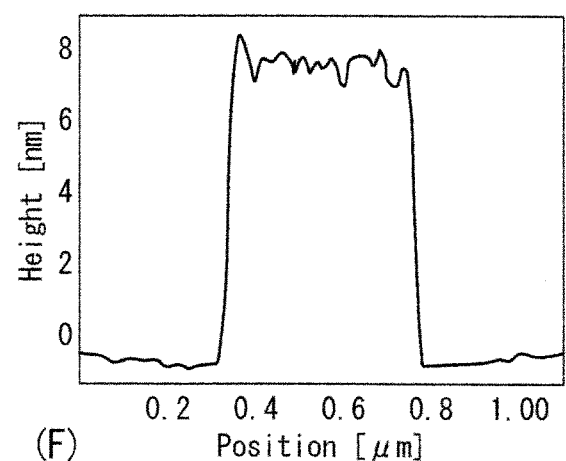
(E)
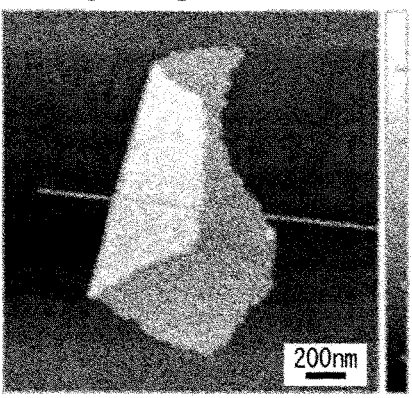
(F)
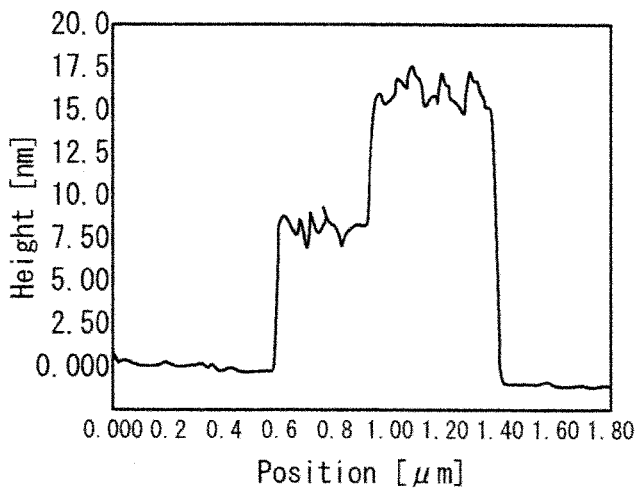

[Fig. 4]
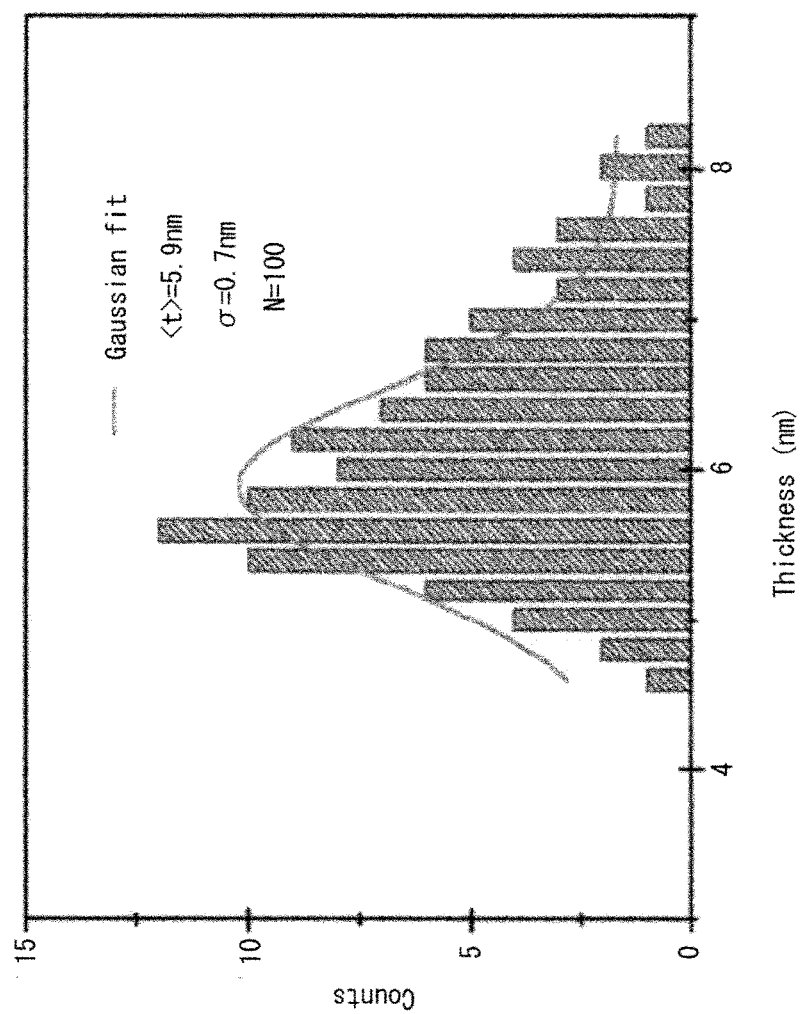
[Fig. 5(A)]
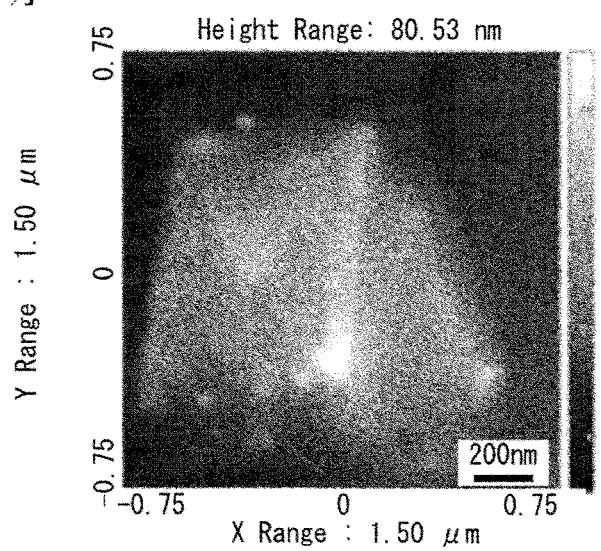

[Fig. 5(B)]
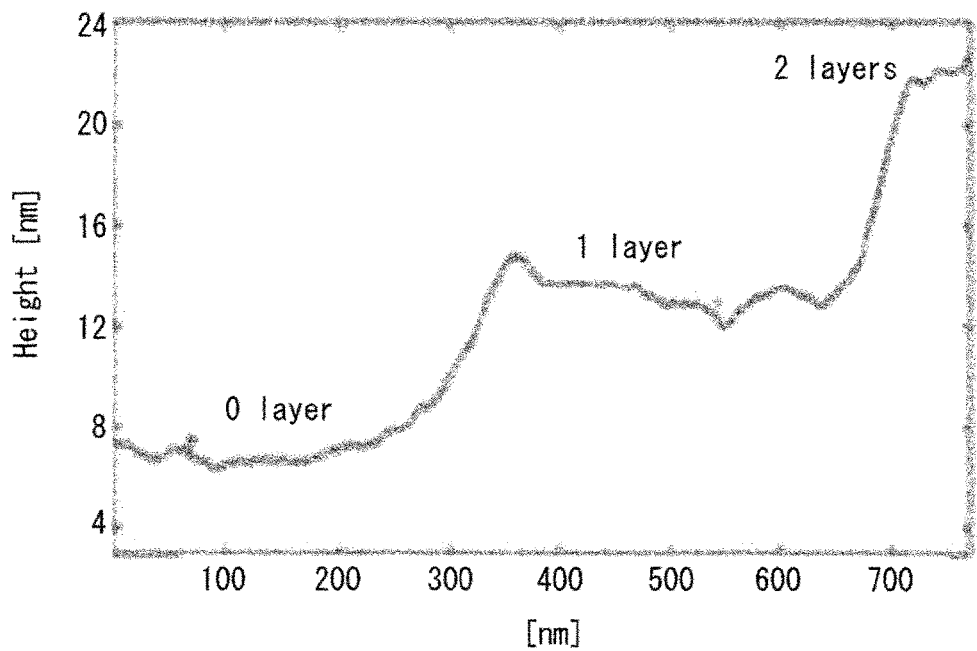
[Fig. 5(C)]
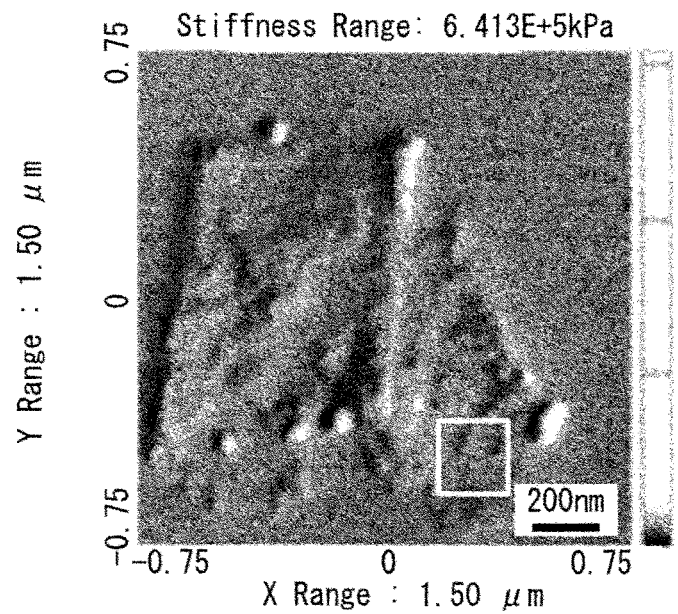

[Fig. 5(D)]
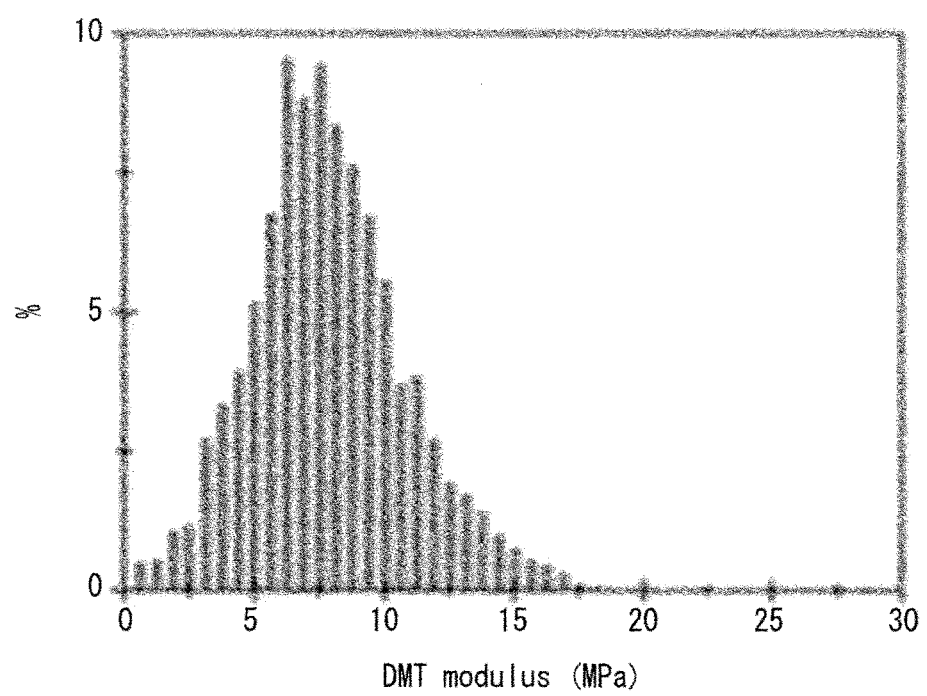

[Fig. 6(A-D)]
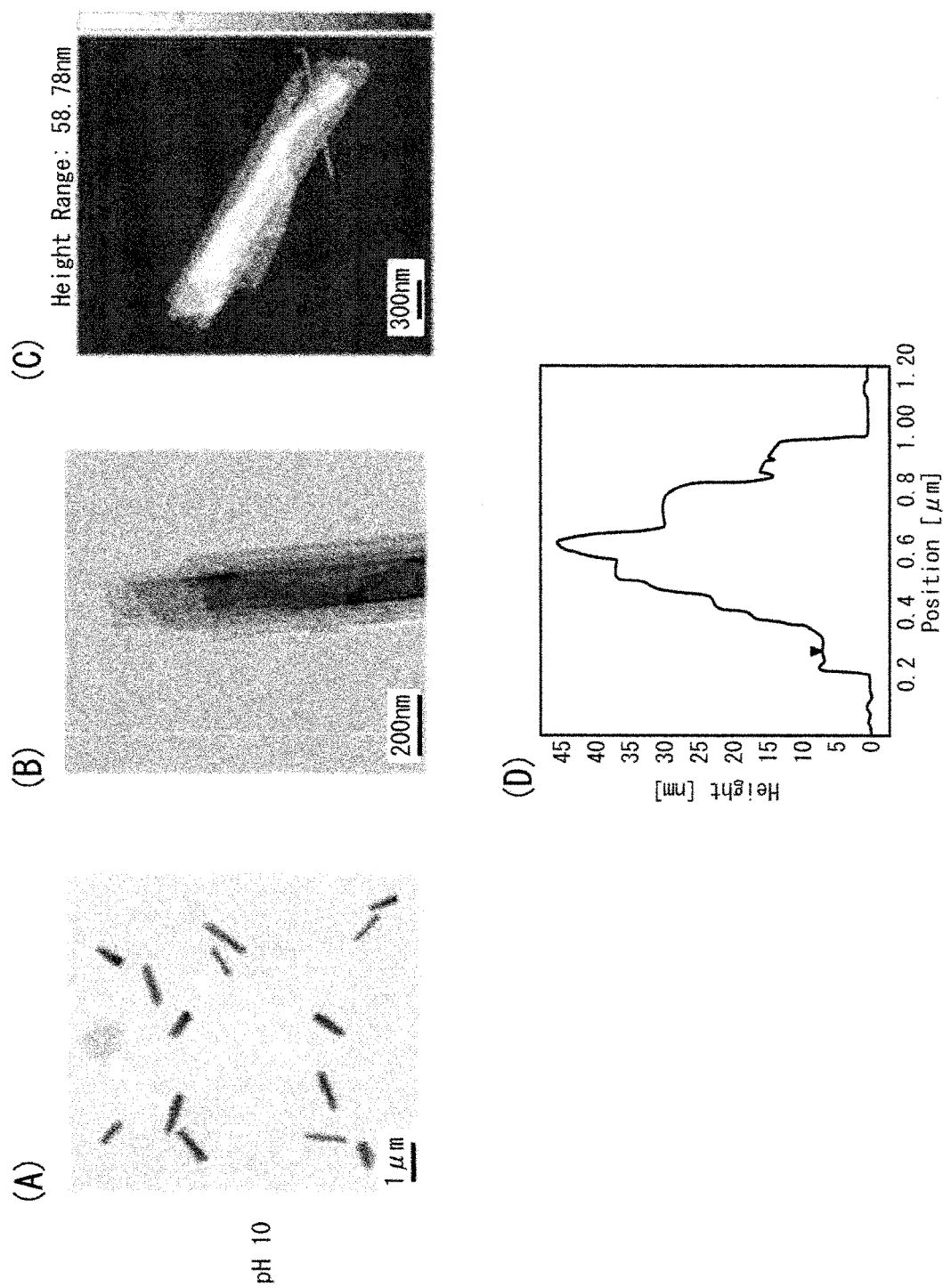

[Fig. 6(E-H)]
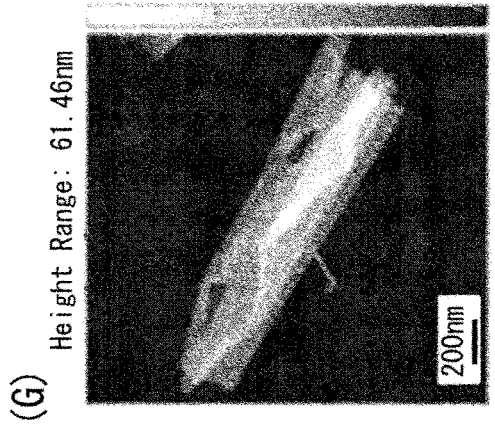
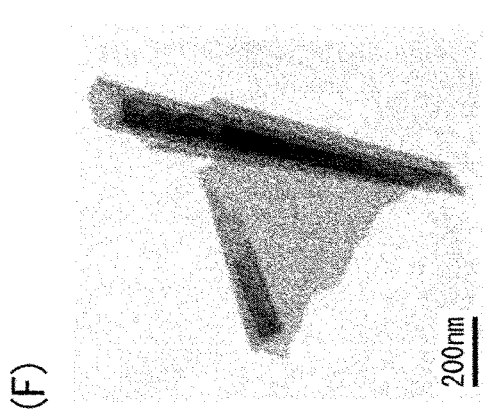
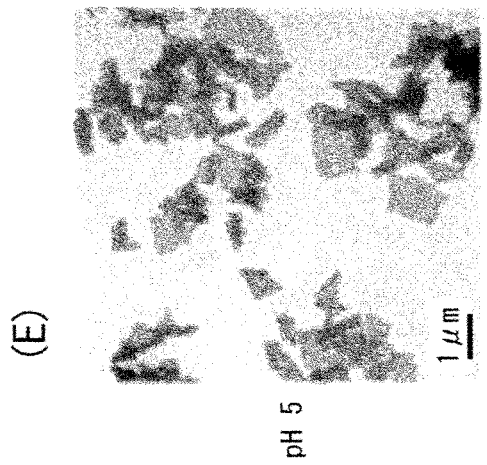
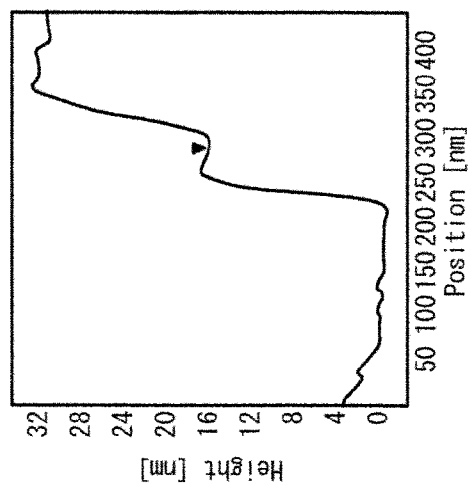

[Fig. 6(I-L)]
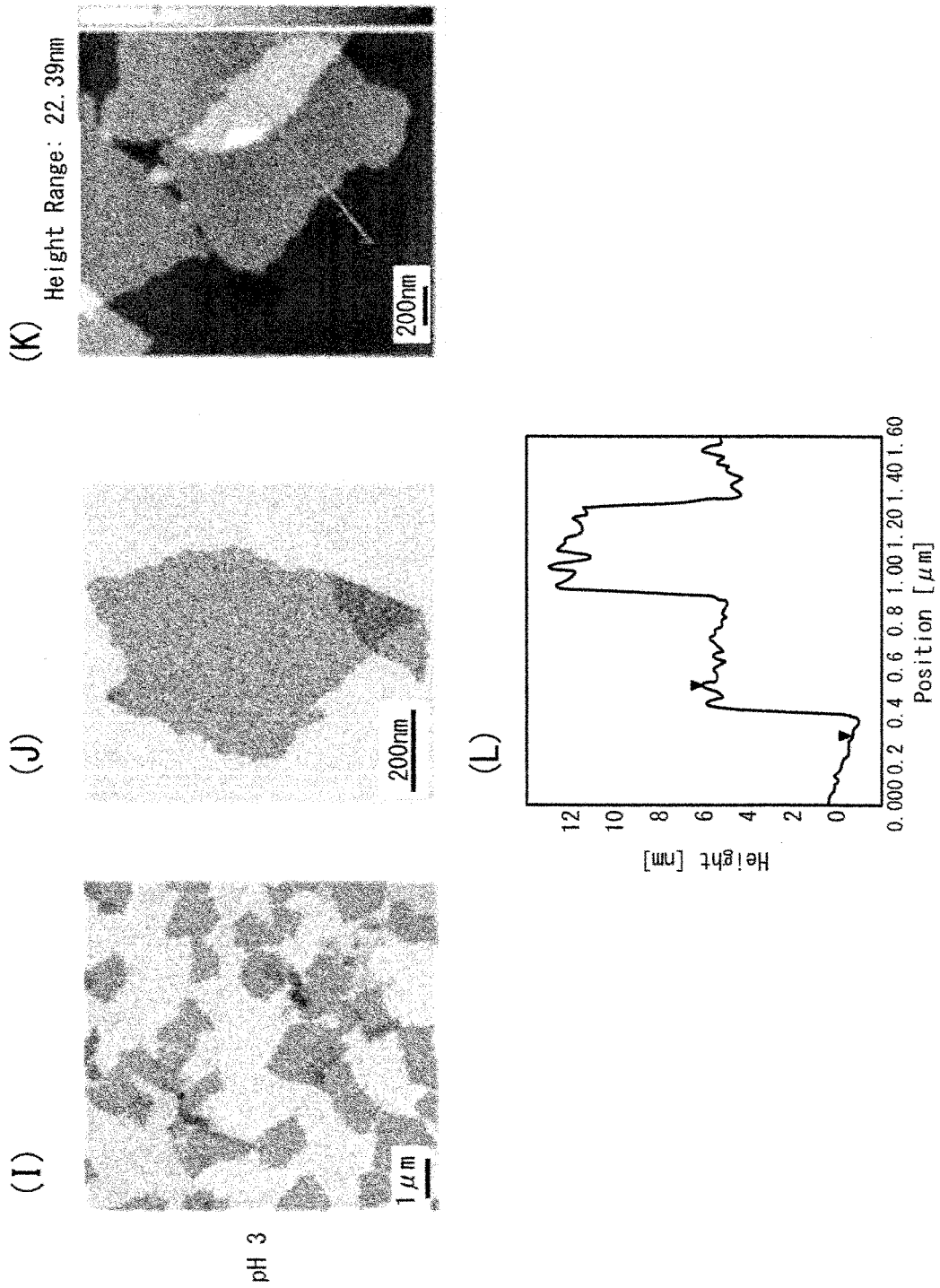

[Fig. 7(A)]
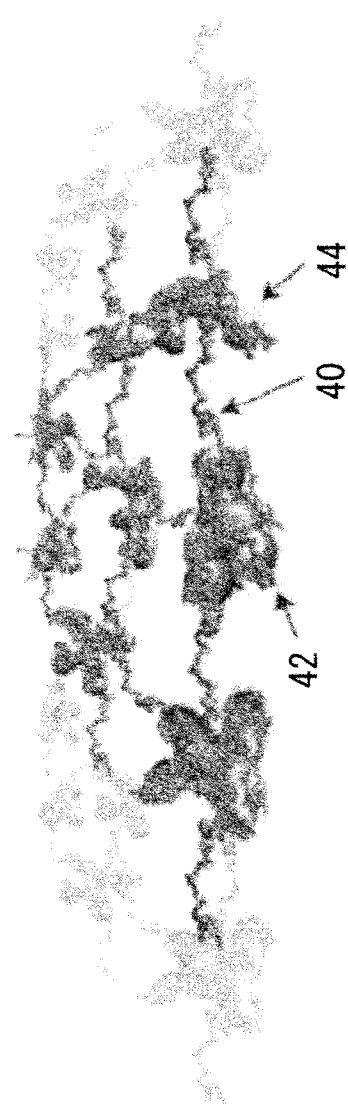

[Fig. 7(B)]
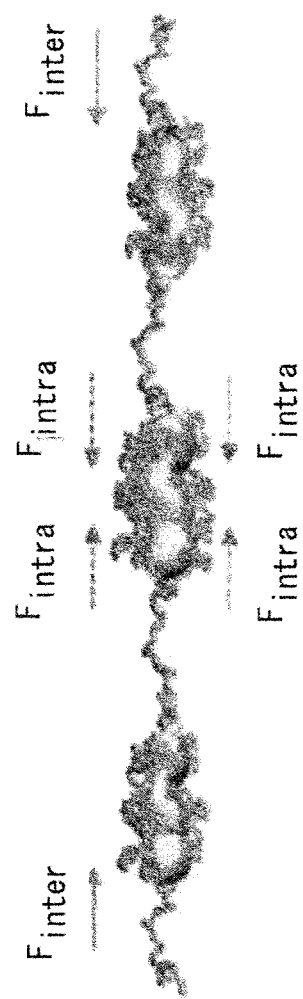

[Fig. 7(C)]
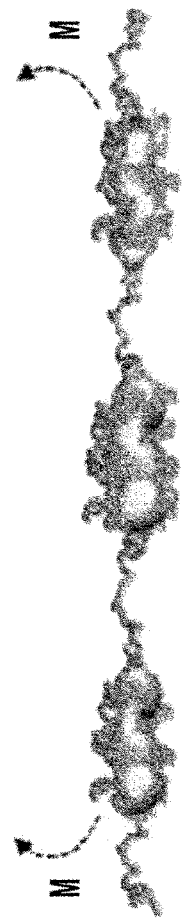
[Fig. 7(D)]
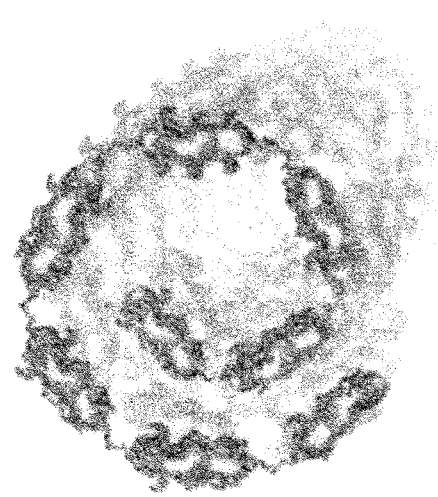

[Fig. 8(A)]
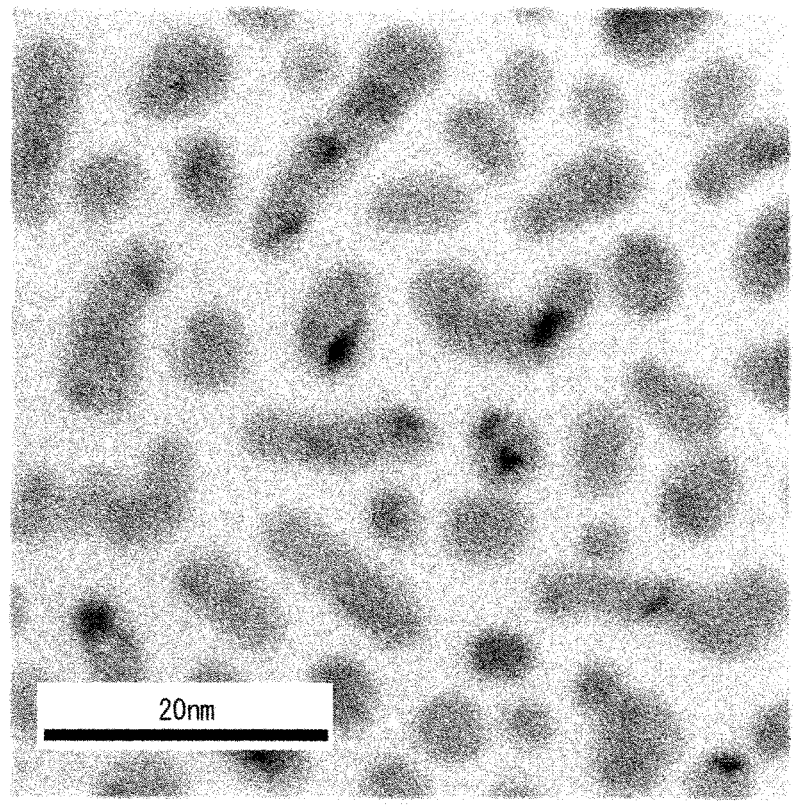
[Fig. 8(B)]
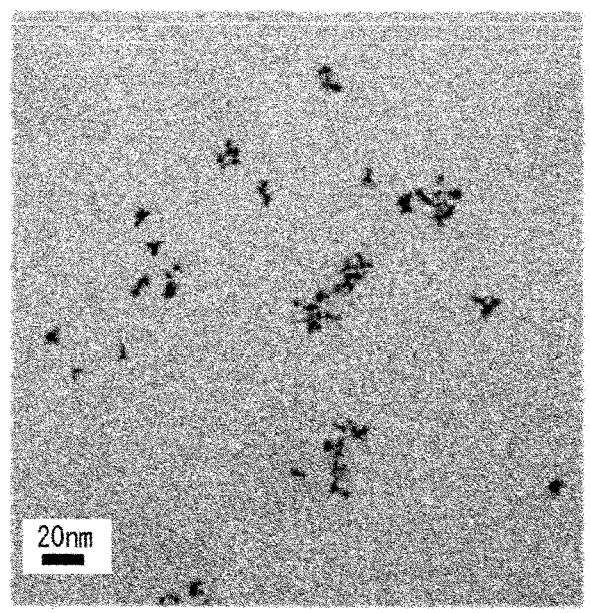

[Fig. 9(A-B)]
(A)
(B)
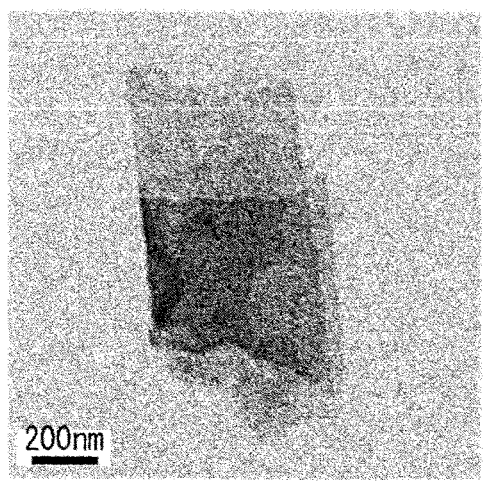

[Fig. 9(C-D)]
(C)
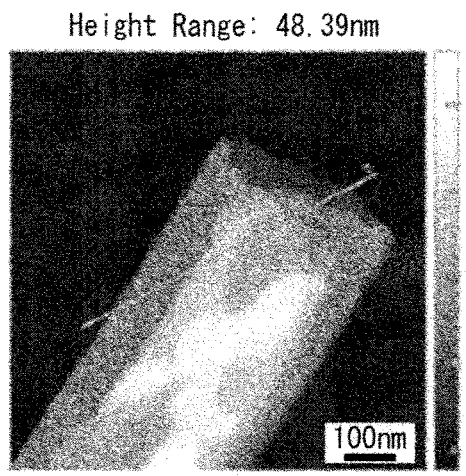
(D)
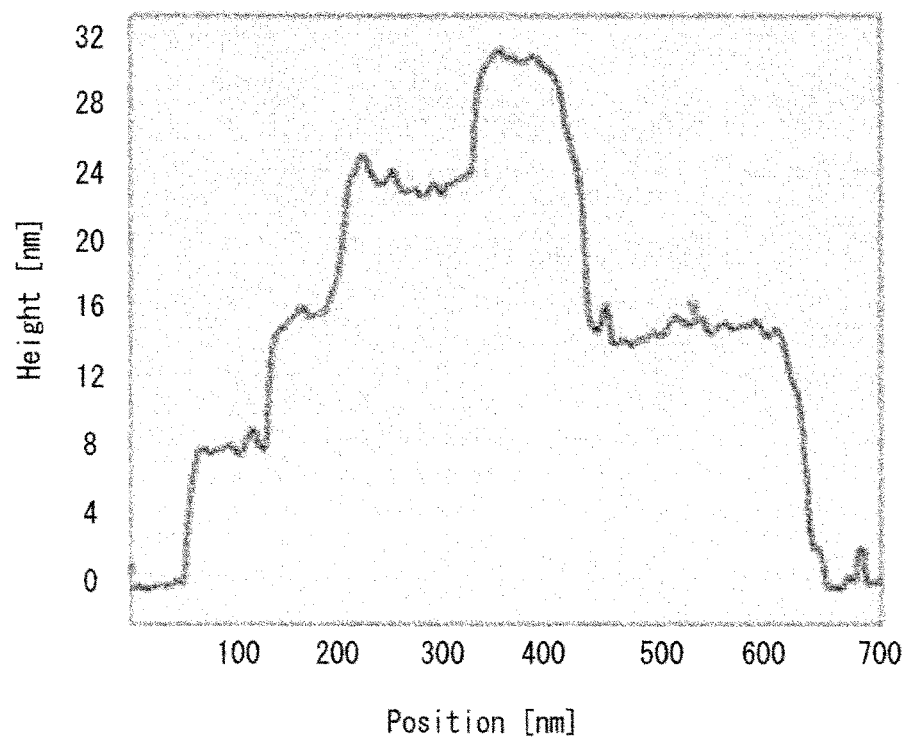

[Fig. 9(E-F)]
(E)
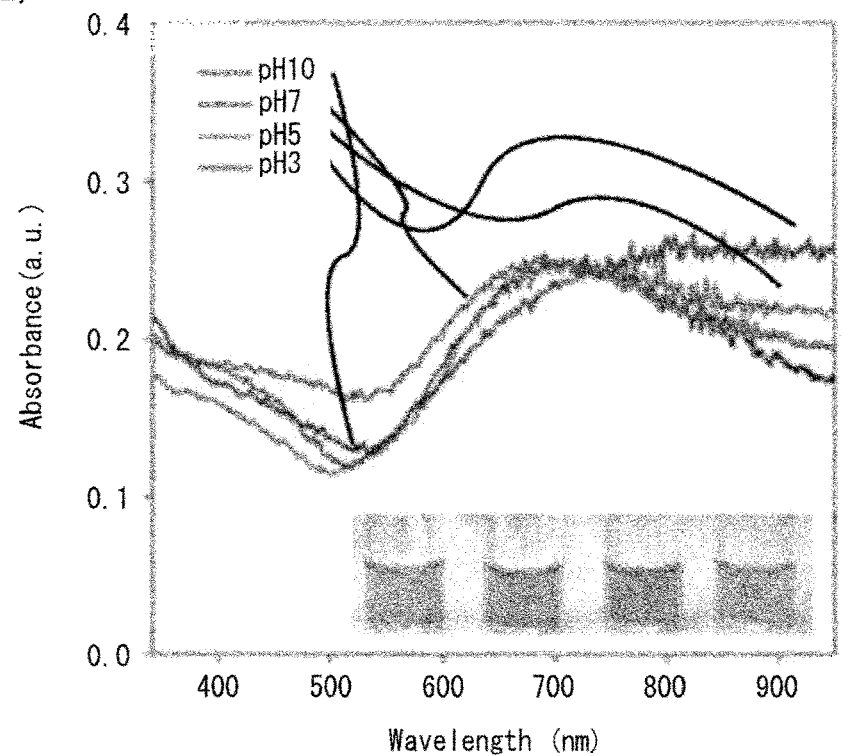
(F)
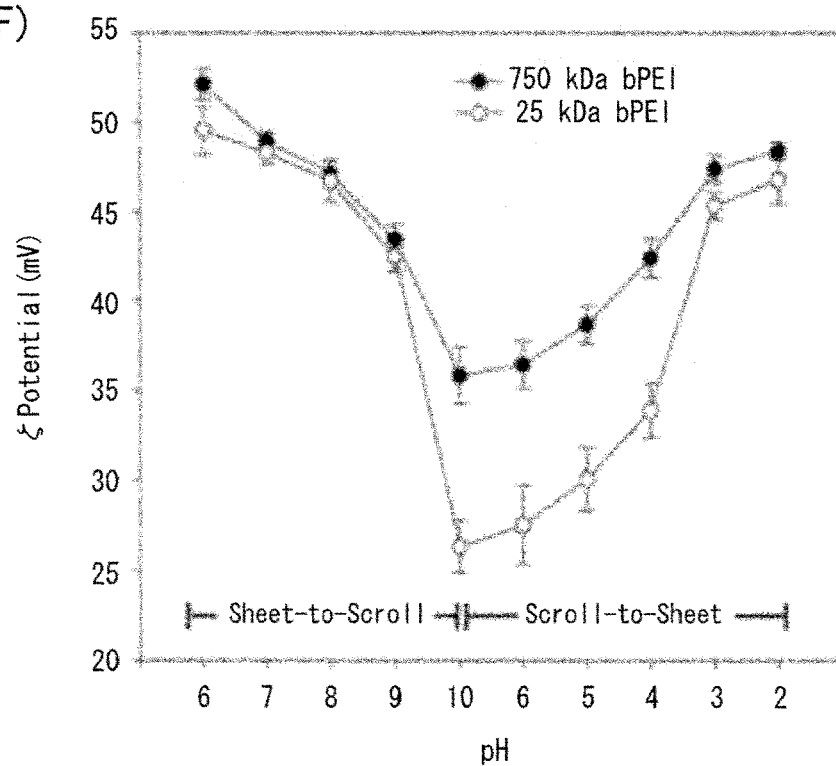

[Fig. 10]
(A)
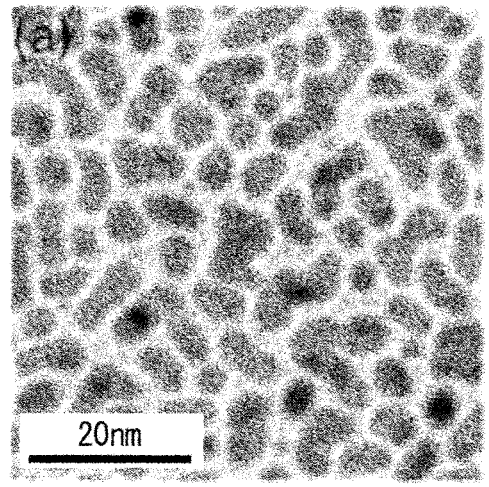
(B)
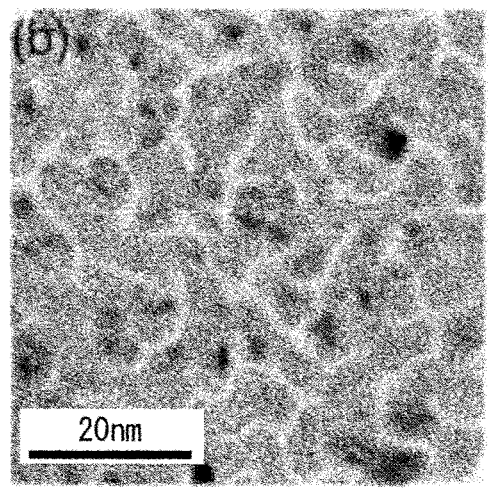

[Fig. 10]
(C)
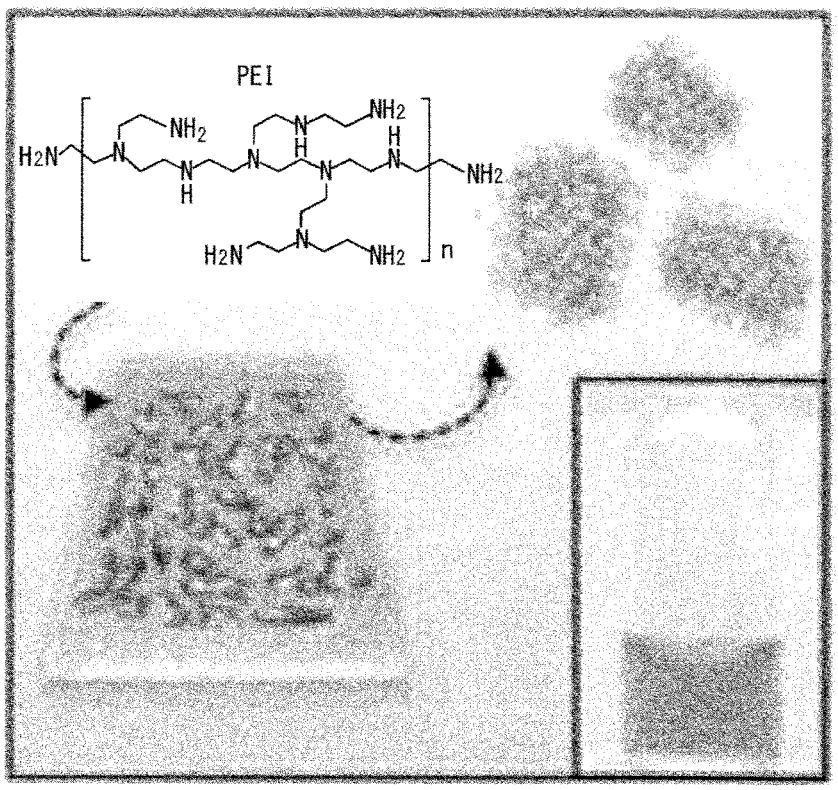
(D)
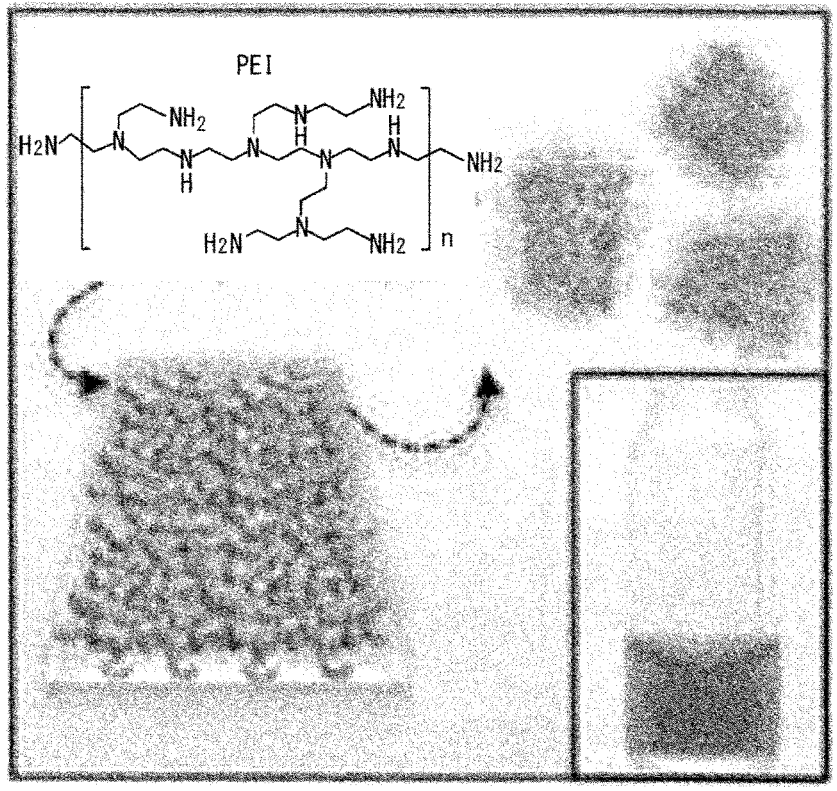

[Fig. 10]
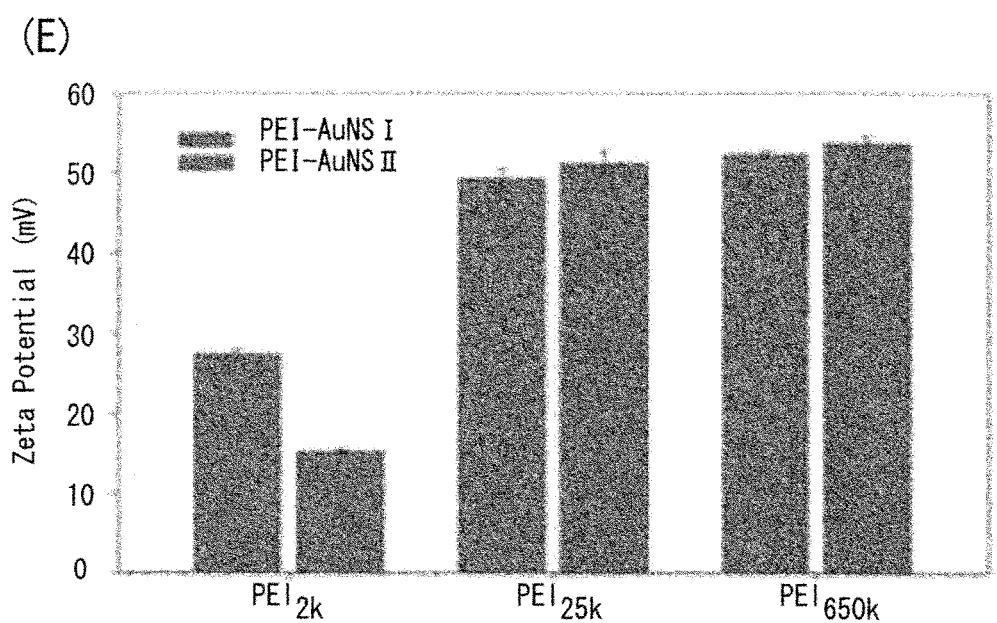

[Fig. 11]
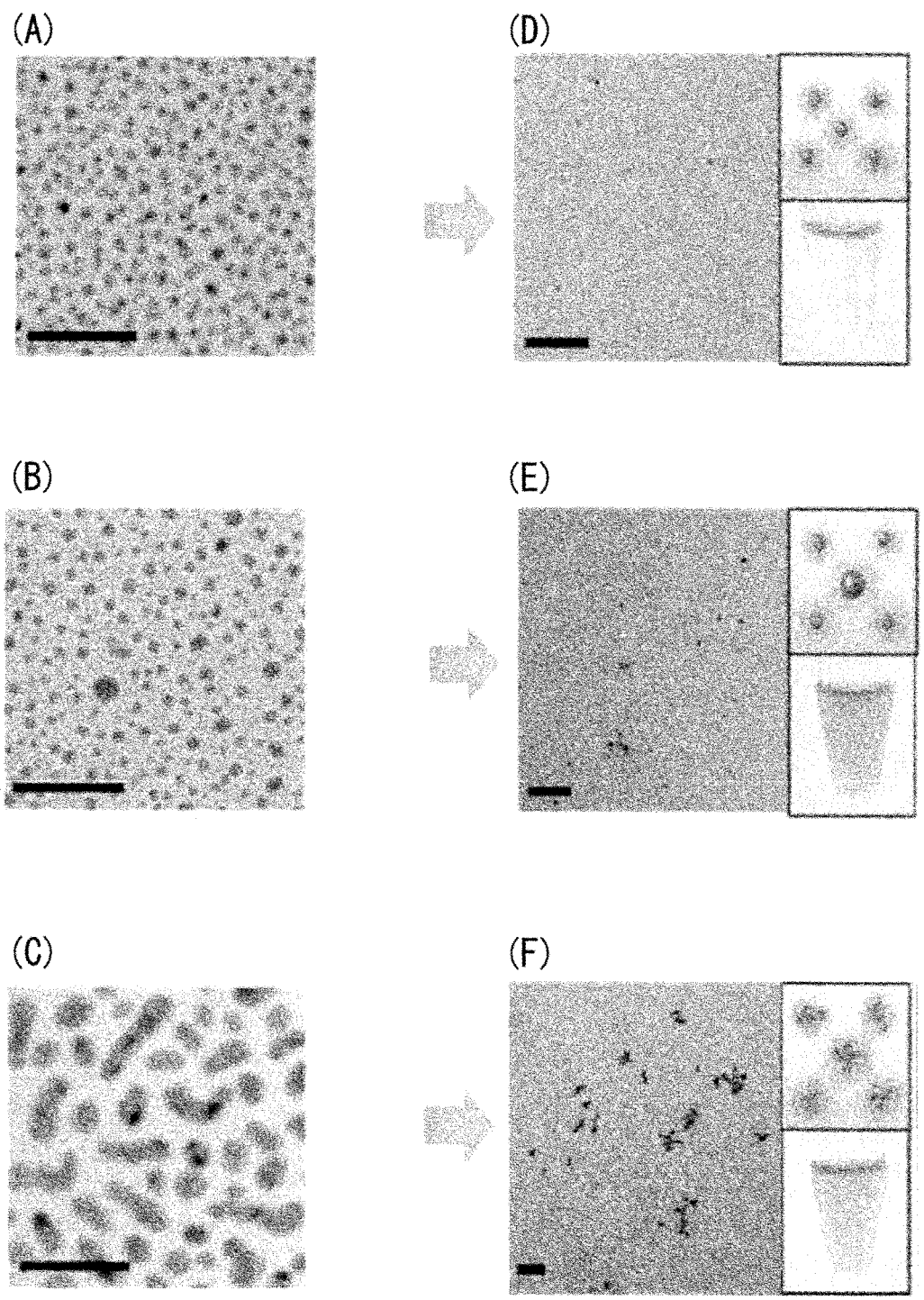

[Fig. 12(A-B)]
(A)
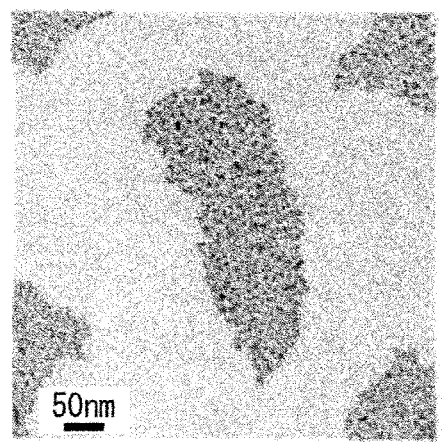
(B)
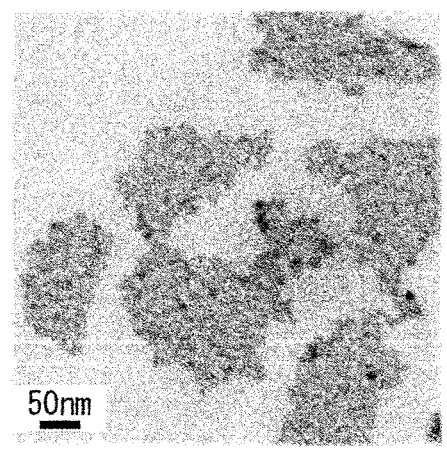

[Fig. 12(C-D)]
(C)
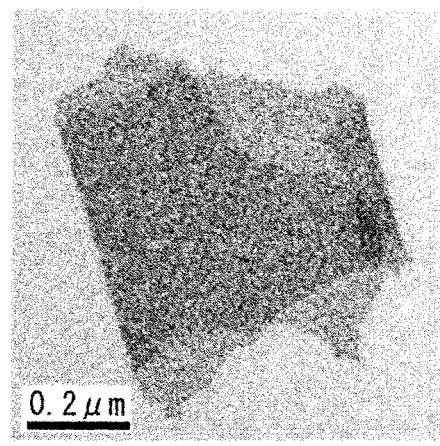
(D)
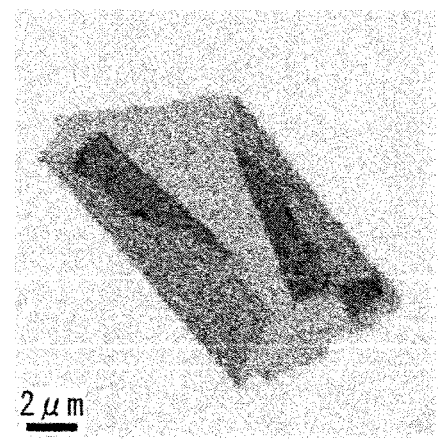

[Fig. 12(E-F)]
(E)
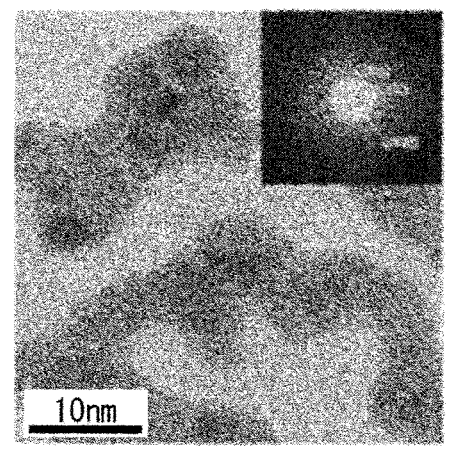
(F)
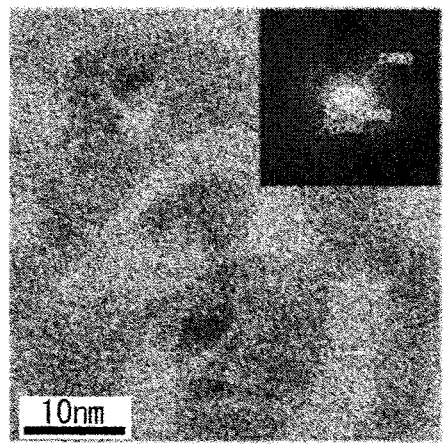

[Fig. 13(A-B)]
(A)
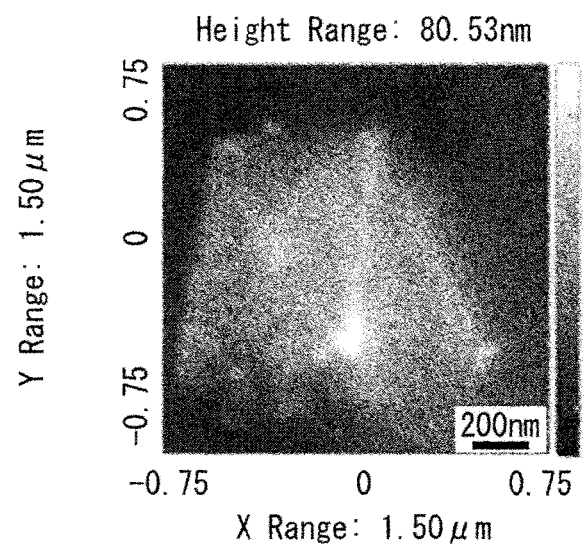
(B)
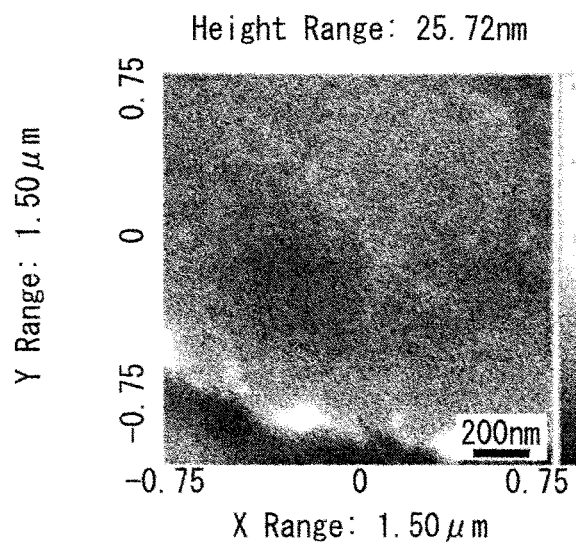

[Fig. 13(C-D)]
(C)
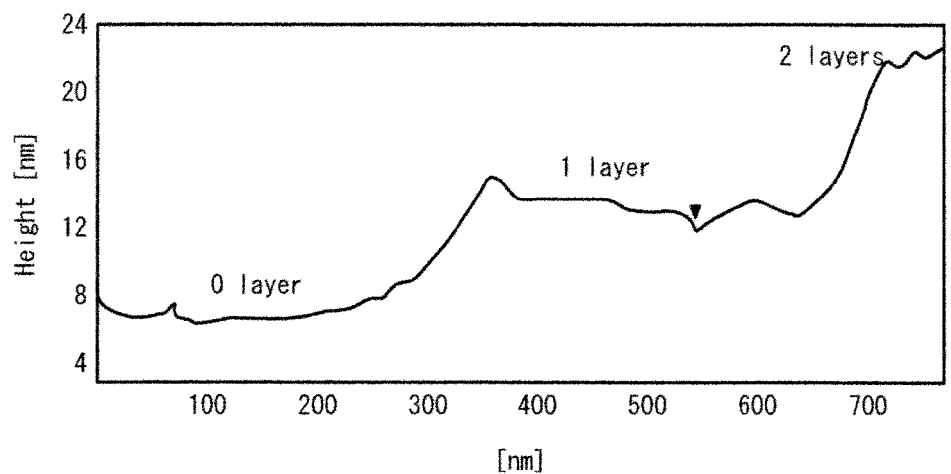
(D)
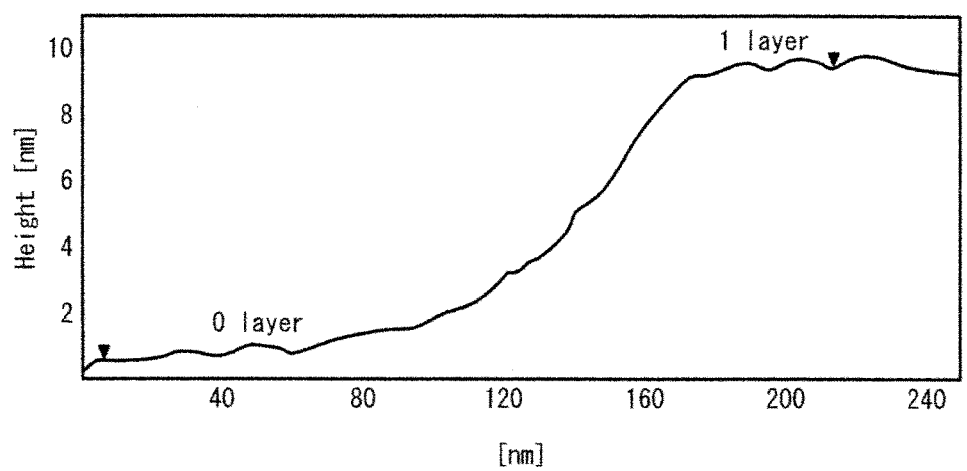

[Fig. 13(E-F)]
(E)
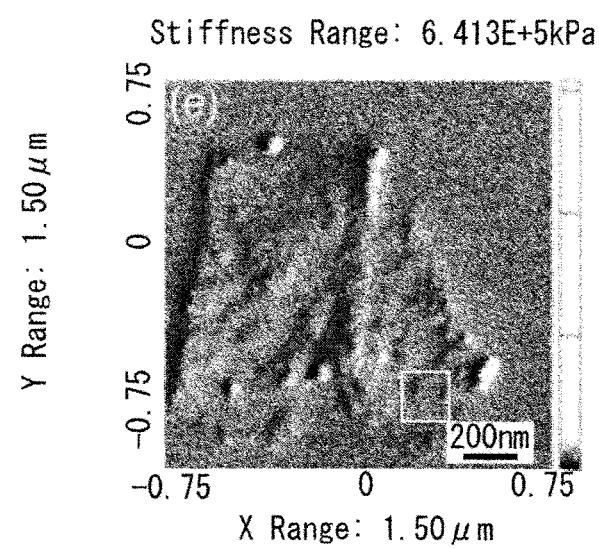
(F)
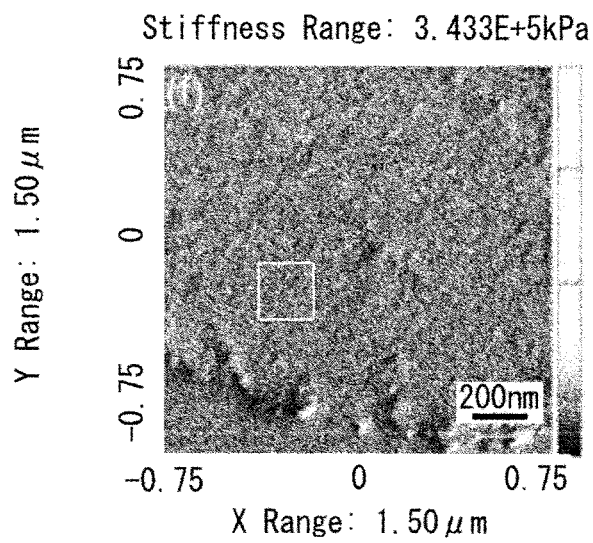

[Fig. 13(G-H)]
(G)
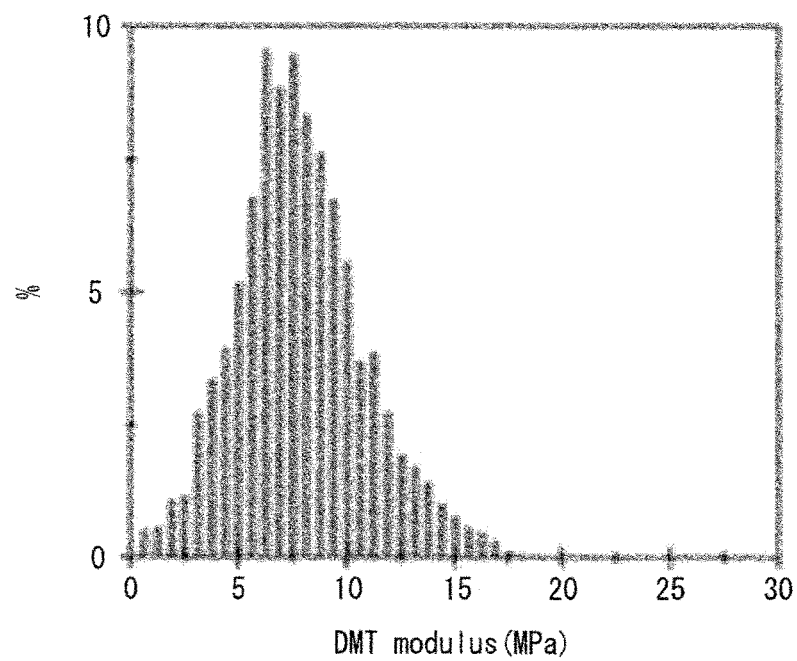
(H)
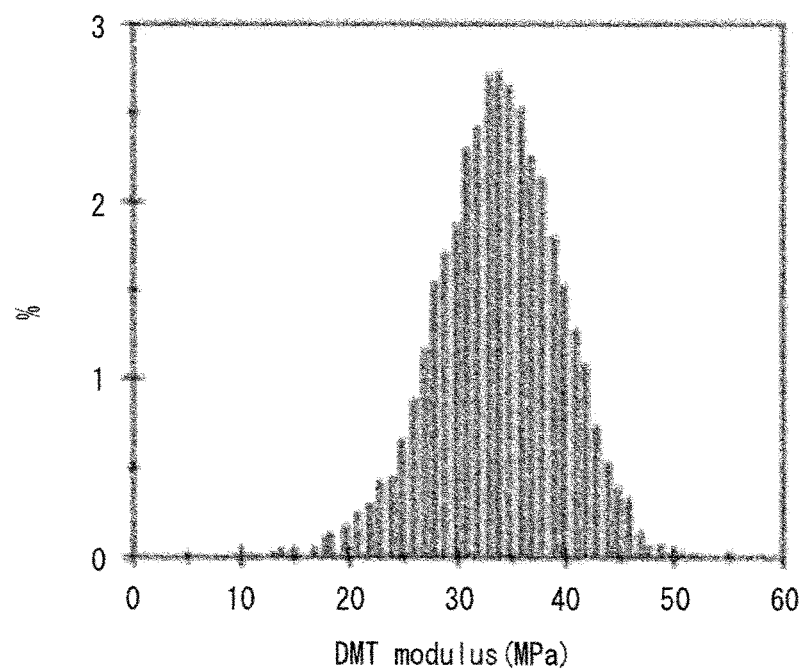

[Fig. 14]
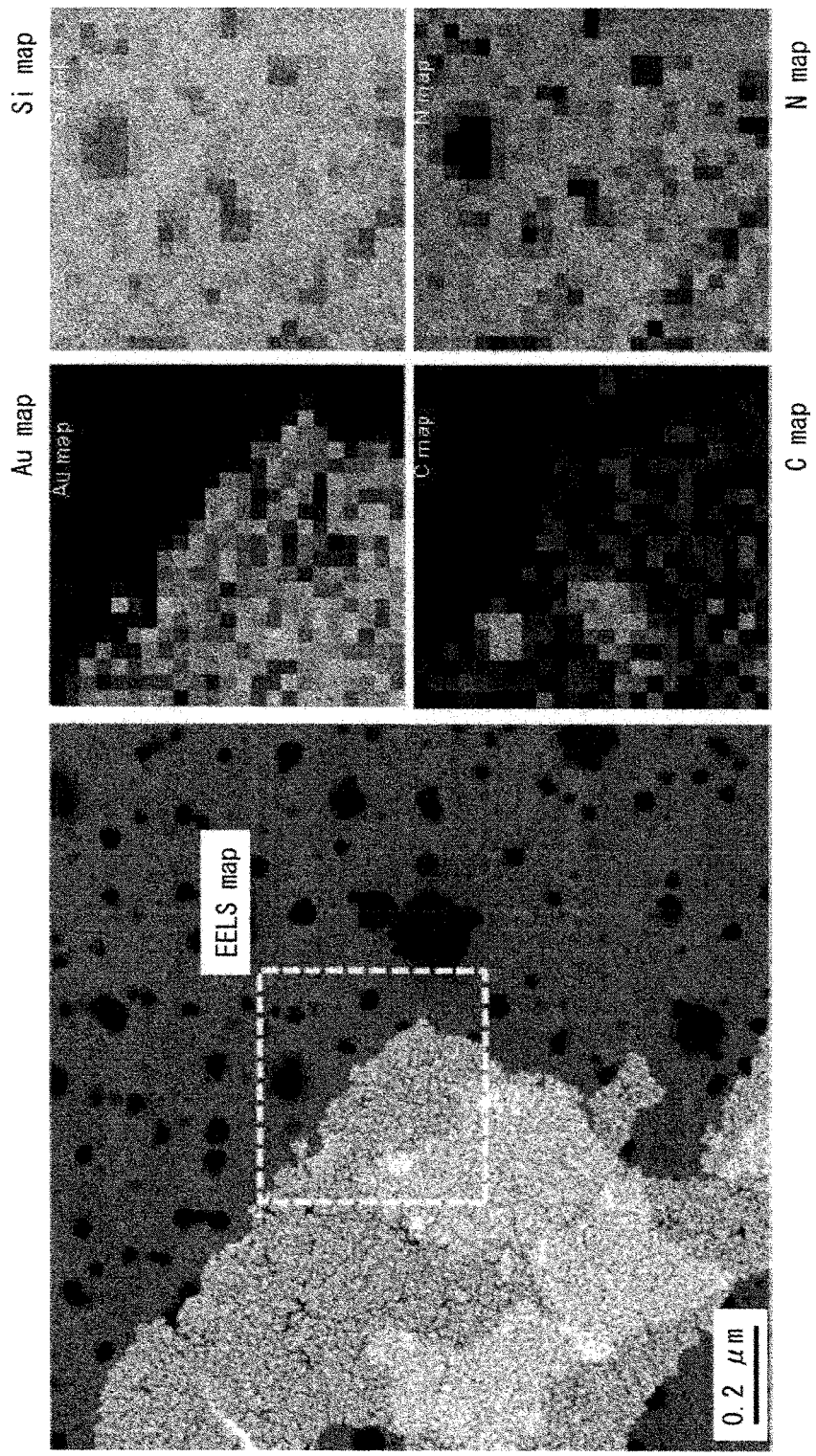

[Fig. 15]
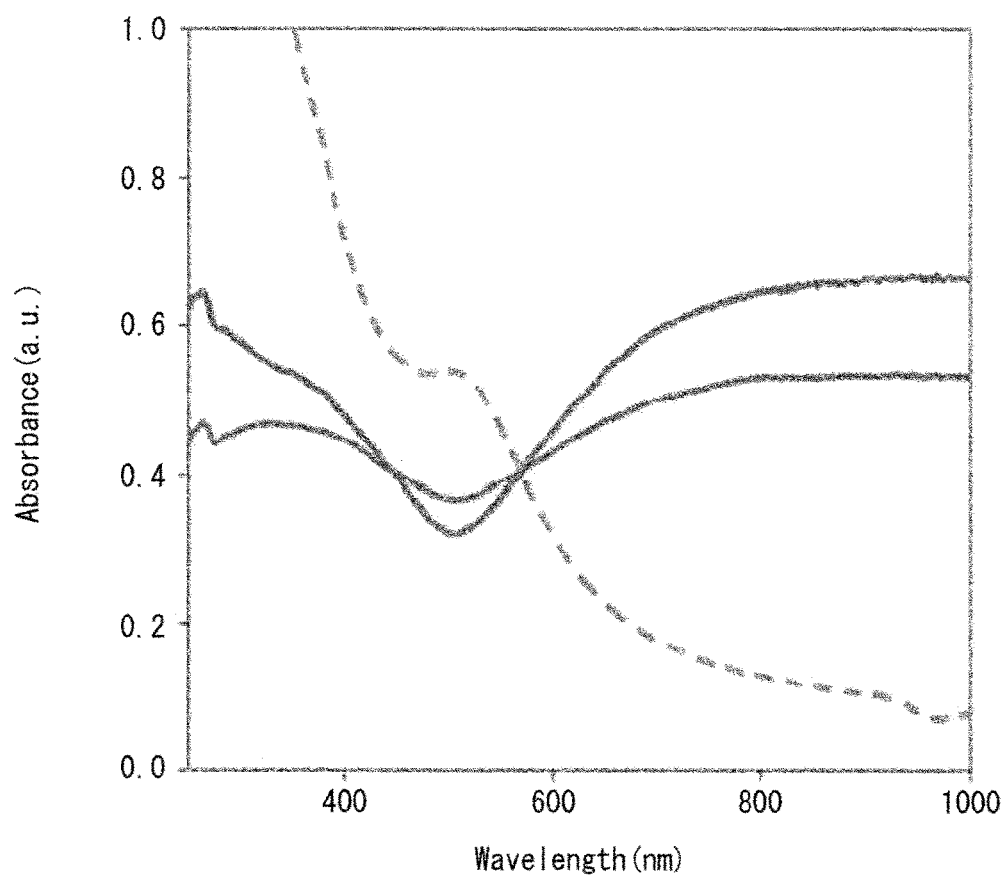

CONTROLLABLE AND REVERSIBLE PH-RESPONSIVE ROLLABLE 2D NANO STRUCTURES

TECHNICAL FIELD

The present invention relates to designs and assembly of pH-responsive rollable 2-dimensional nanostructures. This application hereby incorporates by reference U.S. Provisional Application No. 61/942,274, filed Feb. 20, 2014, in its entirety.

BACKGROUND ART

Nature abounds with examples of how the properties of living systems are correlated to (determined by) their sophisticated, multiscale (hierarchical macro/micro/nano) structure, such as the self-cleaning effect of lotus (Nelumbo nucifera) leaves, the colors of butterfly wings and peacock feathers, the adhesive properties of gecko feet, the anisotropic wetting function of rice leaves, the anti-reflectivity of some insect wings and eyes, etc. Inspired by such living systems, a great number of studies have been conducted, which resulted in real-world technologies, e.g., coatings with self cleaning properties, photonic structures which can serve as optical waveguides and beam splitters, etc. The comprehensive reviews on bio-inspired smart materials and their applications can be found in NPL (Non-patent literature) Nos. 8-12, listed below, for example.

More interestingly, the nature is full of examples of living organisms exploiting the relationship between materials responsive properties and multiscale structure to respond efficiently to external stimuli. The multiscale MS system of living organisms—composed of a skeleton made of structured bones, muscles, tendons, ligaments, etc.,—provides shape, support, flexibility, stability and movement to the body, making it possible to lift large loads (NPL Nos. 13-16). The significance of the multiscale structure-property relationship in such organisms is that their responses to stimuli are considerably pronounced, however such relationship is not well understood (NPL Nos. 8-11).

In more specific context, Metal-Polymer nanocomposites are of particular interest for a variety of reasons, such as ease of processability, prospects for large-scale manufacturing, and considerably lower density than pure metals (NPL Nos. 33-38). Furthermore, they exhibit tunable optical and mechanical properties which can be realized by altering their geometry and composition (NPL Nos. 34-38). In particular, Au-PEI nanocomposites with size and shape dependent surface plasmon resonance (SPR) have been extensively investigated (NPL Nos. 39-42), for various applications ranging from biosensing (NPL No. 39) to gene expression (NPL No. 40). For example, a colorimetric assay method for the quantitative detection of heparin has been studied using Au-PEI nanoparticles (NPs) as an optical probe (NPL No. 39). The detection principle is based on a simple electrostatic interaction between the positively charged Au-PEI NPs and negatively charged heparin in solution that leads to aggregation of the Au-PEI NPs and hence a red-shift in the UV-Vis absorption signal. Au-PEI NPs have been also utilized as a potential non-viral gene carrier for intracellular siRNA delivery (NPL No. 40). The PEI polyelectrolyte acts as both the reductant and stabilizer on the formation of colloidally stable Au-PEI NPs, which binds siRNA electrostatically without showing any significant cytotoxicity (NPL No. 41). Recently, self-assembling 2D nanocomposites by PEI-stabilized AuNPs has gained increased attention in the field of nanofabrication for the development of multifunctional optical devices (NPL No. 42). Au-PEI NPs have been assembled at a solvent/water interface (e.g., toluene/water) into a 2D film with high surface area-to-volume ratio for plasmonic enhancement and surface-enhanced Raman scattering (SERS) (NPL No. 42).

CITATION LIST

Non Patent Literature

NPL 1: A. Martien et al. Emerging applications of stimuli-responsive polymer materials. Nat. Mater. 9, 101-113 (2010).

NPL 2: R. Lupitskyy, Y. Roiter, C. Tsitsilianis, S. Minko, From Smart Polymer Molecules to Responsive Nanostructured Surfaces. Langmuir 21, 8591-8593 (2005).

NPL 3: S. T. Milner, Polymer brushes. Science 251, 905-914 (1991).

NPL 4: P. M. Mendes, Stimuli-responsive surfaces for bio-applications. Chem. Soc. Rev. 37, 2512-2529 (2008).

NPL 5: M. R. Aguilar, C. Elvira, A. Gallardo, B. Vasquez, J. S. Roman, 2007. Smart polymers and their applications as biomaterials. In: N. Ashammakhi, R. L. Reis, E. Chiellini, (eds.), Topics in Tissue Engineering, V. 3, University of Oulu, Finland, pp. 2-27.

NPL 6: A. Kumar, A. Srivastava, I. Y. Galaev, B. Mattiasson, Smart polymers: physical forms and bioengineering applications. Prog. Polym. Sci. 32, 1205-37 (2007).

NPL 7: H. Meng, H., G. Li, Reversible switching transitions of stimuli-responsive shape changing polymers. J. Mater. Chem. A. 1, 7838-7865 (2013).

NPL 8: C. Sanchez, H. Arribart, M. M. Giraud-Guille, Biomimetism and bioinspiration as tools for the design of innovative materials and systems. Nat. Mater. 4, 277-288 (2005).

NPL 9: K. Liu, Y. Tian, L. Jiang, Bio-inspired superoleophobic and smart materials: Design, fabrication, and application. Prog. Mater. Sci. 58, 503-564 (2013).

NPL 10: K. Liu, L. Jiang, Bio-inspired design of multiscale structures for function integration. Nanotoday 6, 155-175 (2011).

NPL 11: H. D. Espinosa, J. E. Rim, F. Barthelat, M. J. Buehler, Merger of structure and material in nacre and bone-Perspectives on de novo biomimetic materials. Progress in Materials Science 54, 1059-1100 (2009).

NPL 12: A. Finnemore, P. Cunha, T. Shean, S. Vignolini, S. Guldin et al., Biomimetic layer-by-layer assembly of artificial nacre. Nat. Commun. 3, 966-972 (2012).

NPL 13: R. I. Close, Dynamic properties of mammalian skeletal muscles. Physiol. Rev., 52, 129-197 (1972).

NPL 14: R. O. Ritchie, M. J. Buehler, P. Hansma, Plasticity and toughness in bone. Phys. Today 62, 41 (2009).

NPL 15: E. Henneman, C. B. Olson, Relations between structure and function in the design of skeletal muscles. J. Neurophysiol. 28, 581-598 (1965).

NPL 16: C. K. Choudhury, S. Roy, Structural and dynamical properties of polyethylenimine in explicit water at different protonation states: a molecular dynamics study. Soft Matter 9, 2269-2281 (2013).

NPL 17: X. Gong, T. Ngai, Interactions between solid surfaces with pre-adsorbed poly (ethylenimine) (PEI) layers: effect of unadsorbed free PEI chains. Langmuir 29, 5974-5981 (2013).

NPL 18: M. Schwartzkopf, A. Buffet, V. Korstgens, E. Metwalli, K. Schlage et al., From atoms to layers: in situ gold cluster growth kinetics during sputter deposition. Nanoscale 5, 5053-5062, (2013).

NPL 19: X. Yu, P. M. Duxbury, G. Jeffers, M. A. Dubson, Coalescence and percolation in thin metal films. Phys. Rev. B 44, 13163-13166 (1991).

NPL 20: R. Songmuang, C. Deneke, 0. G. Schmidt, Rolled-up micro- and nanotubes from single-material thin films. Appl. Phys. Lett. 89, 223109-223109 (2006).

NPL 21: X. Li, Strain induced semiconductor nanotubes: from formation process to device applications. J. Phys. D: Appl. Phys. 41, 193001-193013 (2008).

NPL 22: P. Cendula, S. Kiravittaya, I. Moonch, J. Schumann, 0. G. Schmidt, Directional roll-up of nanomembranes mediated by wrinkling Nano Lett. 11, 236-240 (2010).

NPL 23: R. Ma, Y. Bando, T. Sasaki., Directly rolling nanosheets into nanotubes. J. Phys. Chem. B 108, 2115-2119 (2004).

NPL 24: L. M. Viculis, J. J. Mack, R. B. Kaner, A chemical route to carbon nanoscrolls. Science 299, 1361-1361 (2003).

NPL 25: O. G. Schmidt, K. Eberl, Nanotechnology: Thin solid films roll up into nanotubes. Nature 410, 168-168 (2001).

NPL 26: S. T. Milner, T. A. Witten, M. E. Cates, Theory of the grafted polymer brush. Macromolecules 21, 2610-2619 (1988).

NPL 27: S. T. Milner, T. A. Witten, M. E. Cates, Effects of polydispersity in the end-grafted polymer brush. Macromolecules 22, 853-861 (1989).

NPL 28: T. W. Kelley, P. A. Schorr, K. D. Johnson, M. Tirrell, C. D. Frisbie, Direct force measurements at polymer brush surfaces by atomic force microscopy. Macromolecules 31, 4297-4300 (1998).

NPL 29: M. Muller, Phase diagram of a mixed polymer brush. Physical Review E 65, 030802-4 (2002).

NPL 30: J. Siegel, O. Lyutakov, V. Rybka, Z. Kolska, V. Svorcik, Properties of gold nanostructures sputtered on glass. Nanoscale Res. Lett. 6, 96 (2011).

NPL 31: M. C. Dixon, T. A. Daniel, M. Hieda, D. M. Smilgies, M. H. Chan et al., Preparation, structure, and optical properties of nanoporous gold thin films. Langmuir 23, 2414-2422 (2007).

NPL 32: D. F. Evans, G. Pye, R. Bramley, A. G. Clark, T. J. Dyson et al., Measurement of gastrointestinal pH profiles in normal ambulant human subjects. Gut 29, 1035-1041 (1988).

NPL 33: Shameli, K.; Ahmad, M. B.; Al-Mulla, E. J.; Ibrahim, N. A.; Shabanzadeh, P.; Rustaiyan, A.; Abdollahi, Y.; Bagheri, S.; Abdolmohammadi, S.; Usman, M. S., Molecules, 2012, 17, 8506.

NPL 34: Kumar, S. K.; R. Krishnamoorti, Ann. Rev. Chem. Biomol. Eng., 1, 37.

NPL 35: Li, S.; Lin, M.-M.; Toprak, M. S.; Kim, D.-K.; Muhammed, M., Nano Reviews 2010, 1, 5214.

NPL 36: Gao, B.; Rozin, M. J.; Tao, A. R., Nanoscale, 2013, 5, 5677.

NPL 37: Shenhar, R.; Norsten, T. B.; Rotello, R. M., Adv. Mat., 2005, 17(6), 657.

NPL 38: Shao X.; Nilius N.; Freund H.-J., Phys. Rev. B. 2012, 85, 15444.

NPL 39: Shen, M.; Shi, X., Coll. Surf. A., 419(20), 2013, 80.

NPL 40: Thomas, M.; Klibanov, A. M., PNAS, 2003, 100(16), 9138.

NPL 41: Song, W. J.; Du, J.-Z.; Sun, T.-M.; Zhang, P.-Z.; Wang, J., Small, 2010, 6(2) 239.

NPL 42: Kim, K.; Lee, J. W.; Shin, K. S., Spectrochim. Acta. A, 2013, 100, 15.

NPL 43: Thompson C. V., Ann. Rev. Mater. Sci., 1990, 20, 245.

SUMMARY OF INVENTION

Technical Problem

However, the assembly of free standing or stable dispersions of 2D plasmonic materials remains a difficult task. Moreover, stable and reliable synthesis methods for making thin 2D Au-PEI nanosheets (NS) have not been available. Furthermore, ultrathin 2D Au-PEI having superior properties are not yet available. Detailed characteristics of the Au-PEI and their mechanism have not been fully understood, thereby hindering some potential applications.

Accordingly, the present invention is directed to 2-dimensional nanostructures, and more particularly, to ultrathin 2D Au-PEI nanosheets (NS) and their manufacturing methods.

An object of the present invention is to provide designs and assembly of pH-responsive rollable 2-dimensional nanostructures.

Another object of the present invention is to provide ultrathin 2D Au-PEI nanosheets (NS) and their manufacturing methods.

Solution to Problem

To achieve these and other advantages and in accordance with the purpose of the present invention, as embodied and broadly described, in one aspect, the present invention provides a method for making pH responsive two-dimensional nano-sheets, comprising: forming a polyethyleneimine (PEI) matrix on a substrate; depositing gold on the PEI matrix until a percolating gold film is formed thereon; and dipping the PEI matrix with the percolating gold film into a solution to exfoliate the PEI matrix with the gold into a plurality of two-dimensional sheets, separated from the substrate, the resulting sheets being foldable in response to a pH value surrounding thereto.

The method may further include purifying and re-suspending the plurality of sheets in deionized water. The solution may be a methanol solution. The step of dipping may include applying ultra-sonication to the PEI matrix with the percolating gold film in order to exfoliate into the plurality of two-dimensional sheets. The substrate may be a silicon wafer. Further, the step of depositing the gold on the PEI matrix may include sputtering the gold onto the PEI matrix on the substrate until the percolating gold film is formed thereon.

In another aspect, the present invention provides a two-dimensional nano-sheet that is foldable in response to a surrounding pH value, comprising: a polyethyleneimine (PEI) chain taking a two-dimensional form; and a plurality of domains made of gold, attached to the PEI chain, the plurality of domains of gold forming a percolating gold film on the PEI chain, wherein the nano-sheet is foldable in response to a surrounding pH value. Here, the two-dimensional nano-sheet may be plasmonic.

Advantageous Effects of Invention

According to one or more aspects of the present invention, it becomes possible to provide a nano-scale sheets that are responsive to the surrounding pH and foldable accordingly. The embodiments of the present invention can find applications such as artificial muscles, drug delivery systems (the gastrointestinal tract has pH ranging from 2 to 10) as well recognized in the art (NPL No. 32), self-healing coatings, and molecular tubes, etc. The disclosed innovative methods used to prepare these NSs is reliable and compatible with different metals and smart polymers. Aside from the apparent industrial applicability, the basic understanding achieved and the model developed herein help improve the properties of the nanosheets as well as find various other applications.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

It is to be understood that both the foregoing general description and the following detailed description are exemplary and explanatory, and are intended to provide further explanation of the invention as claimed.

BRIEF DESCRIPTION OF DRAWINGS

FIG. 1 shows schematics of a manufacturing method for NSs according to an embodiment of the present invention. As shown in FIG. 1(A), bPEI matrix was spin-coated onto a silicon wafer. FIG. 1(B) schematically shows that after the step shown in FIG. 1(A), Au was sputtered onto the polymer-coated Si until a percolating Au thin film was obtained, forming the Au skeleton. FIG. 1(C) schematically shows that the sample obtained in FIG. 1(B) was dipped in methanol and exfoliated by ultra-sonication. FIG. 1(D) shows that purification and re-suspension of the NSs in deionized water after the step shown in FIG. 1(C).

FIG. 2 show effects of deposition time on Au film growth. FIG. 2(A) is a TEM image of the as-deposited Au films on PEI showing nucleation of nano-islands after 15 seconds. FIG. 2(B) is the same TEM image at 30 seconds, showing growth of nano-islands.

FIG. 2(C) shows the same TEM image at 45 seconds, showing that the growth of irregularly shaped elongated nanodomains. FIG. 2 (D) shows the same TEM pictures at 60 seconds, showing percolating Au films at 60 s at 4 W. In FIGS. 2(A) to 2(D), the scale bars are 20 nm.

FIG. 3 shows various characterizations of the NSs according to an embodiment of the present invention. FIG. 3(A) is a TEM image of exfoliated irregularly shaped large NSs. FIG. 3(B) is a TEM image of exfoliated irregularly shaped small NSs. The size can be tuned by sonication (power and time). FIG. 3(C) shows a tapping mode AFM topography image of the NSs according to an embodiment of the present invention on Si substrate. FIG. 3(D) is a cross-sectional height profile showing the thickness of about 8 nm for the NS shown in FIG. 3(C). FIG. 3(E) shows a tapping mode AFM topography image of a folded precipitated NS according to an embodiment of the present invention. FIG. 3(F) is a cross-sectional height profile of the NS shown in FIG. 3(E), clearly showing that the folded region is twice the thickness of the unfolded region.

FIG. 4 shows a histogram of the thickness of the NSs according to an embodiment of the present invention. The average thickness was determined to be 5.9+−0.7 nm.

FIG. 5 shows a nanomechanical mapping of a folding NMS. FIG. 5(A) is a peak force tapping mode topography of a folded NSs according to an embodiment of the present invention.

FIG. 5(B) is an associated cross sectional height profile of the folded NMS shown in FIG. 5(A), taken along the section indicated in the solid line in FIG. 5(A).

FIG. 5(C) shows a nanomechanical mapping of the folded NMS shown in FIG. 5(A), demonstrating that both surfaces of the NMS are polymer coated. The Derjaguin-Muller-Toporov (DMT) modulus maps show that the Au domains cannot be distinguished from the surrounding polymer, and the moduli (E) of the exfoliated NMS were homogeneous across the surface.

FIG. 5(D) shows a distribution of the DMT modulus within the region of interest indicated in the square in FIG. 5(C).

FIG. 6 shows the effects on the NSs according to an embodiment of the present invention under various pH conditions. FIG. 6(A-D) shows a fully rolled NSs at pH of 10.

FIG. 6(E-H) shows partially unrolled NSs at pH of 5.

FIG. 6(I-L) shows unrolled flat NSs at pH of 3. (A), (E), and (I) are survey TEM images, showing rolled NSs, partially unrolled NSs, and unrolled NSs, respectively. The scrolls are linear with no fragmentation. (B), (F), and (J) are respectively detail TEM images, showing controlled (B) rolled, (F) partially unrolled, and (J) unrolled NSs, respectively. (C), (G) and (K) show AFM topography images, respectively. (D), (H) and (L) are the associated cross-sectional height profiles of (C), (G), and (K), respectively, taken along the solid line shown in (C), (G), and (K), respectively. The AFM data is consistent with the TEM data. Also, the layer thicknesses shown in (D), (H), and (L) are consistent with pre-rolled NSs of FIG. 1.

FIG. 7 schematically shows a model for the dynamics of the NS structure according to an embodiment of the present invention. FIG. 7(A) schematically shows a NS structure showing polymer chains linking nanodomains (ligaments) in a percolating phase indicated by 40, and polymer chains adsorbed onto gold nanodomains 44 (synergists and fixators) indicated by 42 constituting the multiscale NS.

FIG. 7(B) shows that forces acting on each nanodomain include the intra-domain forces Fintra confining (canceling each other) and stabilizing the NSs against aggregation, and the inter-domain forces Finter acting to pull the nanodomains together for the structure depicted in FIG. 7(B).

FIG. 7(C) shows bending moment (M) arising from the coupling between the pH responsive polymer and the percolating nanodomains.

FIG. 7(D) shows that an NS roll is formed as a consequence of the bending moment M driven by strain relaxation.

FIG. 8 shows TEM images of an Au aggregation well below the percolation threshold. FIG. 8(A) shows as-deposited Au thin films prepared below the percolation threshold. FIG. 8(B) shows the exfoliated and aggregated resultant structures.

FIG. 9 shows optical properties and zeta-potential of NSs with differing molecular weights (Mw) of the polymer according to embodiments of the present invention. FIG. 9(A) shows a survey TEM image of the NSs with Ms of 750 kDa at pH 10. FIG. 9(B) shows a detail TEM images of the rolled NSs. The diameter of the rolls increased with increased Mw, and they appear relaxed post precipitation due to the weight of the walls.

FIG. 9(C) is an AFM peak force tapping mode topography of the NS. FIG. 9(D) is the associated cross-sectional height profile of the section indicated as the solid line in the topography of FIG. 9(C), showing that the height of the scroll is proportional to the number of turns.

FIG. 9(E) shows absorbance spectra of multiscale NSs (25 kDa) at pH of 3, 5, 7, and 10, respectively, showing transition from flat shoulder at long-wavelengths at pH 3 (flat NS) to peak consistent with Au plasmon resonance of 1D metallic structure for pH 10 (nanoscrolled NS). The inserted pictures showing NS dispersions are for the pH values decreasing from left to right. FIG. 9(F) shows positive zeta-potentials for the NSs, indicating the stability of NSs at all protonation states corresponding to pH's in the range 3-10.

FIG. 10 shows a method for making nanosheets (NSs) according to an embodiment of the present invention. Au is deposited on a PEI template followed by liquid exfoliation. FIG. 10(A) shows a TEM micrograph of Au deposited on a PEI template for 60 seconds (Au-PEI NS I). FIG. 10(B) shows a TEM micrograph of Au deposited on a PEI template for 120 seconds (Au-PEI NS II). In both figures, disconnected and connected Au labyrinthine-like domains are observed. FIG. 10(C) schematically illustrate the step in which the respective Au-PEI nanocomposite was ultrasonicated in methanol for 30 min at 30 W then dispersed in water until a colored colloidal suspension was observed for the Au deposited PEI template of FIG. 10(A). FIG. 10(D) schematically illustrate the step in which the respective Au-PEI nanocomposite was ultrasonicated in methanol for 30 min at 30 W then dispersed in water until a colored colloidal suspension was observed for the Au deposited PEI template of FIG. 10(B). FIG. 10(E) shows Zeta potential measurements for the respective NSs. Zeta potential measurement results indicated enhanced stability at high PEI molecular weights.

FIG. 11 shows TEM micrographs of gold deposited on a PEI template for various time intervals. The scale bar shows 20 nm. FIG. 11(A) shows the gold deposited on a PEI template for 15 seconds. FIG. 11(B) shows the gold deposited on a PEI template for 30 seconds. FIG. 11(C) shows the gold deposited on a PEI template for 45 seconds. FIG. 11(D) shows the harvested PEI-Au nanostructures corresponding to FIG. 11(A) in methanol solution. The upper inset shows a schematic representation of the structure. The lower insert shows a micrograph image. FIG. 11(E) shows the harvested PEI-Au nanostructures corresponding to FIG. 11(B) in methanol solution. The upper inset shows a schematic representation of the structure. The lower insert shows a micrograph image. FIG. 11(F) shows the harvested PEI-Au nanostructures corresponding to FIG. 11(C) in methanol solution. The upper inset shows a schematic representation of the structure. The lower insert shows a micrograph image.

FIG. 12 shows TEM images of the exfoliated nanosheets according to embodiments of the present invention. FIG. 12(A) shows Au-PEI NS I with disconnected labyrinthine-like gold domains. FIG. 12(B) shows Au-PEI NS II with connected labyrinthine-like gold domains.

FIG. 12(C) shows NSs made with a lower sonication power. FIG. 12(D) shows NSs made with another lower sonication power. As shown in FIGS. 12(C) and (D), larger lateral dimensions can be obtained by gentle sonication.

FIG. 12(E) shows an HRTE image of the NS (the inset shows FFTs) showing the polycrystalline nature of Au domains. FIG. 12(F) shows another HRTE image of the NS (the inset shows FFTs) showing the polycrystalline nature of Au domains.

FIG. 13 shows surface topography and nanomechanical property mapping of the exfoliated nanosheets. FIG. 13(A) shows an AFM height image of Au-PEI NS I featuring areas with single layer and folded double layer. FIG. 13(B) shows an AFM height image of Au-PEI NS II.

FIG. 13(C) shows a cross section height profile showing a thickness of 5-8 nm of each layer. FIG. 13(D) shows a cross section height profile showing a thickness of 7-10 nm.

FIG. 13(E) shows a DMT modulus map of Au-PEI NS I. FIG. 13(F) shows a DMT modulus map of Au-PEI NS II.

FIG. 13(G) shows the corresponding modulus histogram for FIG. 13(E). FIG. 13(H) shows the corresponding modulus histogram for FIG. 13(F).

FIG. 14 is an HAADF-STEM image, and elemental mapping of a region of Au-PEI NS II (marked by the square), which qualitatively correlates the distribution of Au and C to the microstructure.

FIG. 15 is a UV-Vis absorption spectra of the exfoliated nanosheet suspensions in water. Au-PEI NS I is indicated by a solid curve having about 0.5 absorption at 1000 nm and Au-PEI NS II is indicated by a solid line having about 0.7 absorption at 1000 nm. PEI-AuNPs, which were prepared at t=15 seconds, are shown in the dashed line for reference.

DESCRIPTION OF EMBODIMENTS

What lies beneath Nature's remarkable ability to respond efficiently to external stimuli? To answer this question the present disclosure describes efficient design and facile synthesis of two-dimensional (2D) nanostructures (NSs) that mimic the musculoskeleton (MS) of living systems. The NSs according to the present invention are composed of a metal skeleton embedded in pH-sensitive branched polymer (NPL Nos. 1-7) chains acting as muscles. These NSs are sufficiently stiff to sustain their 2D nature under acidic conditions, yet flexible enough to undergo a fully reversible and controllable shape transformation to nanoscrolls under basic conditions (note that rolling is not spontaneous and stable configurations exist for all protonation/pH states). Remarkably, this occurs despite a mass ratio of the metal to the polymer bearing it of greater than 40. This disclosure demonstrated that this is possible for skeletons only in the form of percolating nanostructured thin films, where a coupling effect between the responsive properties of the polymer and the multiscale structure of the NSs occurs. Notably, a coupling effect between materials responsive properties and a multiscale structure is observed at percolation.

The present disclosure describes what is believed to be the first man-made example of a system mimicking the responsive properties of the MS (musculoskeleton) of a living organism to external stimuli. In one aspect of the present invention, the present inventors designed and synthesized size-tunable, free-standing 2D-NSs, composed of branched polyethylenimine (bPEI, Mw=25 kDa) chains acting as muscles adsorbed onto a skeleton consisting of Au nanodomains in the form of percolating (percolating is the point just before a continuous thin film is formed) thin film. It was found that the resulting NSs undergo a controlled and reversible shape transformation from 2D-NSs to nanoscrolls in response to variation in the pH value of the surrounding medium, despite a mass ratio of the Au to the polymer bearing it of greater than 40. bPEI is chosen because it is a smart polymer "proton sponge," which becomes expanded at protonated states (lower pH values) and shrinks at non-protonated states (higher pH values) (NPL Nos. 16 and 17). The shape transformations at different protonation states, which correspond to different pH values, are monitored by transmission electron microscopy (TEM), atomic force microscopy (AFM), UV-visible spectroscopy, and zeta-potential measurements.

Synthesis Method

In an embodiment of the present invention, to prepare the NSs, processes of physical deposition, chemical exfoliation, and surface adsorption were employed, as illustrated in FIGS. 1(A) to 1(D). FIG. 1 shows schematics of a manufacturing method for NSs according to an embodiment of the present invention. As shown in FIG. 1(A), bPEI matrix was spin-coated onto a silicon wafer. FIG. 1(B) schematically shows that after the step shown in FIG. 1(A), Au was sputtered onto the polymer-coated Si until a percolating Au thin film was obtained, forming the Au skeleton. FIG. 1(C) schematically shows that the sample obtained in FIG. 1(B) was dipped in methanol and exfoliated by ultra-sonication. FIG. 1(D) shows that purification and re-suspension of the NSs in deionized water after the step shown in FIG. 1(C).

Au was sputtered onto a bPEI coated Si substrate until a percolating Au thin film was obtained (see FIGS. 2(A) to 2(D)). FIG. 2 show effects of deposition time on Au film growth. FIG. 2(A) is a TEM image of the as deposited Au films on PEI showing nucleation of nano-islands after 15 seconds. FIG. 2(B) is the same TEM image at 30 seconds, showing growth of nano-islands. FIG. 2(C) shows the same TEM image at 45 seconds, showing that the growth of irregularly shaped elongated nanodomains. FIG. 2 (D) shows the same TEM image at 60 seconds, showing percolating Au films at 60 s at 4 W. In FIGS. 2(A) to 2(D), the scale bars are 20 nm. The Au nucleation and growth into percolating nanodomains evolved as a function of deposition time, as is characteristic of the different stages of Au-thin film formation on a substrate surface (NPL Nos. 18 and 19). To synthesize structures that correspond to muscles, the Au-bPEI film was dipped into methanol, exfoliated by ultrasonication, and the suspension was purified to remove the unbound bPEI chains. Finally, the collected NSs were resuspended in deionized water. The sequence of steps is important. In the first step, the polymer chains connecting multiple domains (analogous to ligaments) and polymer chains adsorbed only onto the lower surface of Au nanodomains (synergists) are formed. Post-exfoliation, polymer chains adsorbed only onto the upper surface of the Au nanodomain (fixators) are formed from unbound bPEI chains in the solution. No additional ligaments can be formed due to the strong electrostatic repulsion forces between the adsorbing and adsorbed ligaments. bPEI is a cationic polyelectrolyte with 1:2:1 (in theory) primary, secondary and tertiary amine groups, adsorbed strongly onto nanostructured surfaces and, therefore, will not detach except under extreme conditions (NPL No. 17).

Preparation of PEI-Gold Nanocomposites on Glass Substrates

In more detail, all reactions were performed under an atmosphere of nitrogen, and all chemicals were of analytical grade and used without further purification. A 2" fused-silica wafer (polished on both) was thoroughly cleaned in dry methanol for 10 min under ultrasonication and dried with $N_2$ gas. Then, 25 microliters of 50% PEI solution (PEI-2k (MW 2 k Da), PEI-25k (MW 25 k Da), or PEI-650k (MW 650 k Da), Sigma-Aldrich, St. Louis, US) was dissolved in 225 microliters of methanol solution and gently dispensed onto the cleaned glass wafer. A thin polymer film was formed by spin-coating at 3,000 rpm for 30 sec (MS-A-150 spin-coater, MIKASA, Japan). The Au was sputtered by a physical vapor deposition (PVD) technique. Au nanostructures were deposited by magnetron sputtering using a 2" Au target (99.99%) (Ted Pella, Inc., Redding, Calif., US). Five sets of Au nanostructures were grown on the PEI-coated substrate for deposition times of 15, 30, 45, 60 and 120 sec with a DC power of 4 W. No in situ or ex situ heat treatment was performed during the deposition.

Liquid Exfoliation of the Nanosheets

Au-PEI on fused silica samples were immersed in methanol and sonicated at 20 kHz for 30 min at 10 W (30 W for nanometer-sized fragmentation of Au-NSs), with a Hone T-01 diameter-3.9 mm sonication tip attached to an ultrasonic homogenizer (Model 150 V/T, BioLogics Inc., Manassas, Va., US); followed by a separation step to discard excessive PEI polymers using a centrifuge at 80,000 rpm. After evaporating the remaining portion of methanol solution, the suspended PEI-AuNSs were redispersed in ultrapure water from a Milli-Q system (Nihon Millipore K.K., Tokyo, Japan) using 0.1 micrometer filters. The protonation state/pH value was adjusted by adding 1M NaOH or 1M HCl and mildly agitating for 12 h.

Analysis-Evaluation

AFM Characterization and Nanomechanical Mapping

A Multimode 8 AFM (Bruker, Calif.) system was used for surface topography and nanomechanical property mapping. The AFM scans and Derjaguin-Muller-Toporov (DMT) modulus measurements were performed in peak force mode using a commercial siliconnitride triangular cantilever tips (spring constant 0.35 N/m, resonant frequency 65 kHz) with a typical radius less than 5 nm. As substrates for AFM measurements, freshly cleaved mica was used. The cleaved mica surfaces exhibited typical RMS roughness of 0.2 nm.

TEM Characterization

TEM was performed using a Cs-corrected FEI Titan 80-300 kV operating at 300 kV. Bright field TEM images were acquired with the aid of a post-specimen spherical aberration corrector, yielding a spatial resolution of 0.09 nm. The porosity and average pore size (interspacing) within the PEI-AuNSs were determined using Image) (NIH shareware) using ISODATA (Iterative Self-Organizing Data Analysis Technique) thresholding algorithms. High-angle annular dark-field (HAADF) scanning transmission electron microscopy (STEM) and energy filtered TEM (EFTEM) were performed with an optimum spatial resolution of 0.136 nm. EDX analysis was performed using an Oxford X-max Silicon Drift Detector (SDD), with detection area of 80 mm^2 and energy resolution of 136 eV (Oxford Instruments, UK).

Zeta Potential Measurements

The zeta potential measurements were performed using the Zetasizer Nano ZSP (Malvern Instruments Ltd, Worcestershire, UK). The Au samples (800 microliters of suspension at a pH of 6) were transferred to a zeta cell (Malvern, UK). After equilibration to a temperature of 25 C for 120 sec, three measurements were carried out where 12 runs was determined automatically by the instrument.

UV-Vis Spectroscopy

The optical absorption spectra were recorded using a Multiskan GO UV/Vis microplate spectrophotometer, Thermo Scientific, USA.

For TEM analysis, a small volume of the suspension was placed onto a carbon grid and the water was allowed to evaporate, leaving the NSs laying flat on the TEM grid indicating the 2D nature of the NSs (FIG. 3(A)). Occasionally, NSs appear to be folded at the edges, as a result of precipitation on the solid support. The size of the NSs was tunable between tens of nanometers and several microns by varying the sonication time and power (FIGS. 3(A) and 3(B)). FIG. 3(A) is a TEM image of exfoliated irregularly shaped large NSs. FIG. 3(B) is a TEM image of exfoliated irregularly shaped small NSs. These figures show that the size can be tuned by adjusting sonication power and time. To measure the thickness, the NSs were dispersed on a silicon (Si) substrate and scanned in peak force tapping mode AFM (FIGS. 3(C) and 3(E)), with associated cross sectional height profiles (FIGS. 3(H) and 3(J)). FIG. 3(C) shows a tapping mode AFM topography image of the NSs according to an embodiment of the present invention on Si substrate. FIG. 3(D) is a cross-sectional height profile showing the thickness of about 8 nm for the NS shown in FIG. 3(C). FIG. 3(E) shows a tapping mode AFM topography image of a folded precipitated NS. FIG. 3(F) is a cross-sectional height profile of the NS shown in FIG. 3(E), clearly showing that the folded region is twice the thickness of the unfolded region. FIG. 4 shows a histogram of the thickness of the NSs. The average thickness of the NSs was determined to be 5.9 nm+−0.7 from 100 cross sectional height profiles (FIG. 4).

The present inventors discovered that varying the thickness of the spin-coated bPEI polymer on the silicon substrate from tens of nanometers to microns did not affect the average thickness of the NSs. This is because the polymer is branched (not cross-linked). Thus, once a single layer of branched polymer has been adsorbed onto the Au nanodomains, there can be no further increase in the thickness of the polymer layer, confirming the validity of the method used to prepare the NSs.

Further, nanomechanical property mapping was performed on a folded NS. The result showed that the polymer is adsorbed onto both sides of the Au nanodomain (FIGS. 5A to 5D). FIG. 5 shows a nanomechanical mapping of a folding NMS. FIG. 5(A) is a peak force tapping mode topography of a folded NSs according to an embodiment of the present invention. FIG. 5(B) is an associated cross sectional height profile of the folded NMS shown in FIG. 5(A), taken along the section indicated in the solid line in FIG. 5(A). FIG. 5(C) shows a nanomechanical mapping of the folded NMS show in FIG. 5(A), demonstrating that both surfaces of the NMS are polymer coated. The Derjaguin-Muller-Toporov (DMT) modulus maps show that the Au domains cannot be distinguished from the surrounding polymer, and the moduli (E) of the exfoliated NMS were homogeneous across the surface. FIG. 5(D) shows a distribution of the DMT modulus within the region of interest indicated in the square in FIG. 5(C).

It was also discovered that the 2D-NSs show a pH-responsive shape transformation to nanoscrolls upon changing the pH value to 10. The nanscrolls unroll partially at pH=5 and fully to flat 2D-NSs at pH=3. This transformation, from the initially flat NSs at a pH=6 (FIG. 3(A)) to nanoscrolls at a pH=10, then to partially unrolled nanoscrolls at a pH=5, and back to flat NSs at a pH=3 is shown in FIGS. 6(A-C), 6(E-G), and 6(I-K), respectively. FIG. 6 shows the effects on the NSs according to an embodiment of the present invention under various pH conditions. FIG. 6(A-D) shows a fully rolled NSs at pH of 10. FIG. 6(E-H) shows partially unrolled NSs at pH of 5. FIG. 6(I-L) shows unrolled flat NSs at pH of 3. (A), (E), and (I) are survey TEM images, showing rolled NSs, partially unrolled NSs, and unrolled NSs, respectively. The scrolls are linear with no fragmentation. (B), (F), and (J) are respectively detail TEM images, showing controlled (B) rolled, (F) partially unrolled, and (J) unrolled NSs, respectively. (C), (G) and (K) show AFM topography images, respectively. (D), (H) and (L) are the associated cross-sectional height profiles of (C), (G), and (K), respectively, taken along the solid line shown in (C), (G), and (K), respectively. The AFM data is consistent with the TEM data. Also, the layer thicknesses shown in (D), (H), and (L) are consistent with pre-rolled NSs of FIG. 1.

These nanoscrolls are uniform with straight edges, with a number of turns depending on the size of the NSs, and have a typical scroll thickness of 2-4 layers (FIG. 6(D)). The NSs and nanoscrolls have consistent dimensions, and no fractions or residual materials were observed on the substrate, indicating that no damage occurred during the shape transformation process, as monitored by TEM (FIGS. 6(A), 6(E), and 6(I)), and AFM topography (FIGS. 6(C), 6(G), and 6(K)) and associated cross-sectional height profiles (FIGS. 6(D), 6(H), 6(L)).

Modeling

To understand the rolling mechanism, the present inventors regarded a stable NS (at pH=6) as a strain-relaxed system composed of thousands of individual bPEI chains, some of which (synergists and fixators) are attached to individual Au nanodomains, and some of which (ligaments) are attached to multiple Au nanodomains.

FIG. 7 schematically shows a model for the dynamics of the NS structure according to an embodiment of the present invention. FIG. 7(A) schematically shows a NS structure showing polymer chains linking nanodomains (ligaments) in a percolating phase indicated by 40, and polymer chains adsorbed onto gold nanodomains 44 (synergists and fixators) indicated by 42 constituting the multiscale NS. FIG. 7(B) shows forces acting on each nanodomain include the intra-domain forces Fintra confining (canceling each other) and stabilizing the NSs against aggregation, and the inter-domain forces Finter acting to pull the nanodomains together for the structure depicted in FIG. 7(B). FIG. 7(C) shows bending moment (M) arising from the coupling between the pH responsive polymer and the percolating nanodomains. FIG. 7(D) shows that an NS roll is formed as a consequence of the bending moment M driven by strain relaxation.

The Au nanodomains exist in a percolating phase (i.e., individual nanodomains preserving the 2D nature of an Au thin film). Initially, the net stress acting on the system is zero. Changing the pH value to 10 shrinks the synergists and fixators, which balance each other, by orders of magnitude, confining the Au nanodomains to a planar structure and stabilizes them against aggregation (by intra-domain forces given by Eq. 1).

$$F_{intra} = \rho_{i-1}^{N} \Sigma_{j-1}^{K} F_{intra} \quad (1)$$

where N is the number of nanodomains and K is the number of chains adsorbed onto each side of the nanodomain (FIG. 7(B)). In contrast, since the Au nanodomains are confined, the ligaments cannot shrink freely (inter-domain forces given by Eq. 2), and thus the extra potential energy is stored in the NS.

$$F_{inter} = \Sigma_{i-1}^{N-1} \Sigma_{j-1}^{M} \Sigma_{i-1}^{G} F_{inter}^{ijk} \quad M \ll N, G, \ll L \quad (2)$$

where N is the number of nanodomains, M≪N reflects that the polymer is branched and not cross-linked, i.e., the interactions are between the nearest neighbors only, and G reflects that any two domains can have more than one ligament connecting them. This energy gives rise to large bending moments (M) acting on the whole NS (FIG. 7(C)) leading to strain-relaxation driven rolling, minimizing the potential energy stored in the system. The bending starts at all edges simultaneously, but rolling occurs along the long edges only, since they experience a larger bending moment than the shorter ones (NPL Nos. 20-22). The NSs have a non-uniform shape and roll into single nanoscrolls (FIG. 7(D)) as shown in FIGS. 6(A) to 6(C).

At different pH values, the polymer shrinks or expands to a varying extent, corresponding to the associated protonation state (NPL Nos. 16 and 17), and therefore it is possible for the nanoscroll to partially unroll in a controlled manner and assume a stable state at any pH value. This is shown for the cases of partially unrolled and flat 2D-NS in the TEM micrographs (FIGS. 6(E) and 6(F)) at pH=5, and (FIGS. 6(I) and 6(J)) at pH=3, respectively. The layered structure is apparent in the AFM images (FIGS. 6(C), 6(G), and 6(K)) and the corresponding cross-sectional height profiles (FIGS. 6(D), 6(H), and 6(L)). It should be noted that, in contrast to other nanoscrolls reported in the literature (NPL Nos. 23-25), the rolling is not spontaneous and stable configurations exist for each protonation state (pH). This evidences novel and useful structures and properties of the NSs presented in this disclosure.

A simple calculation of the mass ratio between the percolating (surface coverage of about 80%) nanostructured Au film (5.5 nm thick confirmed by x-ray reflectivity measurements (NPL No. 18), the electron density=19.30 g/cm^3) and the polymer layers (2 nm total thickness, the electron density=1.03 g/cm^3) shows that the mass ratio is, remarkably, greater than 40. The striking ability of perfect rolling despite this mass ratio is a consequence of the collective effect of the forces (arising from the materials responsive properties of bPEI) between the confined individual nanodomains (fine scale features) that translates into large bending moments acting on the NS (coarse scale feature). This materials responsive property-multiscale structure relationship (levering mechanism) may be referred to as the coupling effect. (The nanodomains are the fine scale features of the multiscale structure of the NS. Due to the structure of the percolating film they are spatially confined within their local surroundings. Therefore, any forces acting on these domains cannot perform any work on them (i.e. the energy is stored rather than dissipated), and thus, eventually, performs significant work on structures at a coarser scale (bending the whole 2D-NS)).

To verify the criticality of the percolating condition, additional experiments were performed on samples prepared with Au skeletons well below the percolation threshold. FIG. 8 shows TEM images of an Au aggregation well below the percolation threshold. FIG. 8(A) shows as-deposited Au thin films prepared below the percolation threshold. FIG. 8(B) shows exfoliated and aggregated resultant structures of FIG. 8(A). As shown in these figures, these samples were found to be unstable, did not form NSs and aggregated upon exfoliation.

It should be noted that these NSs are profoundly different from the previously reported "smart" polymer brushes (NPL Nos. 3 and 26-29). Polymer brushes—a layer of sensitive polymer chains adhered or grafted to a continuous thin film/surface—have properties determined by, rather than coupled to, their structure, and thus the forces are determined by Eq. 1 only.

In general, the diameter of a scroll scales with the thickness of the wall and the net strain in the system. In this disclosure, since the thickness of the 2D-NS is limited by the percolating condition, the strain was tuned by changing the molecular weight (Mw) of the polymer. FIG. 9 shows optical properties and zeta-potential of NSs with differing molecular weights (Mw) of the polymer according to embodiments of the present invention. FIG. 9(A) shows a survey TEM image of the NSs with Ms of 750 kDa at pH 10. FIG. 9(B) shows a detail TEM images of the rolled NSs. The diameter of the rolls increased with increased Mw, and they appear relaxed post precipitation due to the weight of the walls. FIG. 9(C) is an AFM peak force tapping mode topography of the NS. FIG. 9(D) is the associated cross-sectional height profile of the section indicated as the solid line in the topography of FIG. 9(C), showing that the height of the scroll is proportional to the number of turns. FIG. 9(E) shows absorbance spectra of multiscale NSs (25 kDa) at pH of 3, 5, 7, and 10, respectively, showing transition from flat shoulder at long-wavelengths at pH 3 (flat NS) to peak consistent with Au plasmon resonance of 1D metallic structure for pH 10 (nanoscrolled NS). The inserted pictures showing NS dispersions are for the pH values decreasing from left to right. FIG. 9(F) shows positive zeta-potentials for the NSs, indicating the stability of NSs at all protonation states corresponding to pH's in the range 3-10.

When the Mw of the polymer was increased from 25 kDa to 750 kDa the diameter of the nanoscrolls increased, as shown in the TEM micrographs (FIGS. 9(A) and 9(B)). They appear relaxed when precipitated on a solid substrate as result of the increased weight of the walls. The AFM topography and cross-sectional height profile (FIGS. 9(C) and 9(D)) show a thickness proportional to the number of turns.

The shape transformation between nanoscrolls and 2D-NS was monitored by UV-visible spectroscopy and zeta-potential measurements. Absorbance spectra were obtained for NS at several pH values. As the pH value was increased, the absorbance spectra changed from a spectrum typical of a thin film (2D-NS), with a flat shoulder at long wavelengths to a spectrum typical of a metallic 1D nano-structure (nanoscroll) with a peak corresponding to the plasmon resonance of Au and a decreasing absorbance at longer wavelengths (FIG. 9(E)) (NPL Nos. 30 and 31). Zeta-potential values corresponding to the protonation states (pH values) of two different polymers of different molecular weights were measured (FIG. 9(F)). The positive potentials indicate that the structures are stable over a wide range of pH values from 3-10, and confirm that the polymer is strongly adsorbed onto the Au nanodomains (NPL No. 17). The zeta-potential decreases as the NS transitions to the nanoscroll, indicating a decrease in surface area consistent with rolling.

As described above, in one aspect of the present invention, the present inventors discovered a coupling effect between the responsive properties and the multiscale structure of 2D NSs that mimic the musculoskeleton of living organisms. Such a coupling effect arises as a result of the percolating phase of the skeleton. Away from the percolating phase, properties of these systems are simply determined by the structure. The NSs according to the embodiments of the present invention can find applications such as artificial muscles, drug delivery systems (the gastrointestinal tract has pH ranging from 2 to 10) as well recognized in the art (NPL No. 32), self-healing coatings, and molecular tubes. The method used to prepare these NSs is general and is compatible with different metals and smart polymers. Aside from the apparent industrial applicability, the basic understanding achieved and the model developed herein pose important questions of scientific significance: to what extent can this coupling effect be generalized, and can it offer insights into other fields of the physical sciences?

In another aspect of the present invention, the following additional disclosure is provided. Some of the embodiments and descriptions provided below overlap the descriptions provided above.

Extraordinary optical properties can result when plasmonic metal-polymer composites are realized as two-dimensional (2D) materials. The present disclosure also describes a straightforward and cost effective method for green synthesis of thin (5 to 10 nm), flexible, and transferable 2D gold-polyethyleneimine (Au-PEI) nanosheets with labyrinthine-like Au domains. Both free standing and stable colloidal solutions of the size-tunable nanosheets can be obtained. The exfoliated nanosheets exhibit a pronounced tunable surface plasmon resonance response, highly sensitive to the density of Au domains, extending into the near infrared region, which makes them suitable for scientific and technological applications.

Specifically, the present disclosure describes a green and straight forward synthesis method of ultrathin 2D Au-PEI nanosheets (NS). The nanosheets are flexible, transferable and plasmonic. The unique structure, stability, nanomechanical characteristics, and optical properties are described below. The synthesis method is based on Au sputter deposition onto a glass substrate percolated with PEI, followed by liquid exfoliation (FIG. 10).

FIG. 10 shows a method for making nanosheets (NSs) according to an embodiment of the present invention. Au is deposited on a PEI template followed by liquid exfoliation. FIG. 10(A) shows a TEM micrograph of Au deposited on a PEI template for 60 seconds (Au-PEI NS I). FIG. 10(B) shows a TEM micrograph of Au deposited on a PEI template for 120 seconds (Au-PEI NS II). In both figures, disconnected and connected Au labyrinthine-like domains are observed. FIG. 10(C) schematically illustrate the step in which the respective Au-PEI nanocomposite was ultrasonicated in methanol for 30 min at 30 W then dispersed in water until a colored colloidal suspension was observed for the Au deposited PEI template of FIG. 10(A). FIG. 10(D) schematically illustrate the step in which the respective Au-PEI nanocomposite was ultrasonicated in methanol for 30 min at 30 W then dispersed in water until a colored colloidal suspension was observed for the Au deposited PEI template of FIG. 10(B). FIG. 10(E) shows Zeta potential measurements for the respective NSs. Zeta potential measurement results indicated enhanced stability at high PEI molecular weights.

The Au nucleation and growth into labyrinthine-like domains evolved as a direct function of Au deposition time, as is characteristic of the early stages of Au-thin film formation (NPL No. 38). As shown in the TEM micrographs (FIG. 10), with increasing deposition time (t) of Au onto the PEI template there was a transition from (A) disconnected Au labyrinthine-like domains, t=60 s (Au-PEI NS I) to (B) interconnected labyrinthine-like domains, t=120 s (Au-PEI NS II). TEM micrographs of nanostructures for deposition times of t=15 to 45 seconds are shown in FIG. 11 for comparison. FIG. 11 shows TEM micrographs of gold deposited on a PEI template for various time intervals. The scale bar shows 20 nm. FIG. 11(A) shows the gold deposited on a PEI template for 15 seconds. FIG. 11(B) shows the gold deposited on a PEI template for 30 seconds. FIG. 11(C) shows the gold deposited on a PEI template for 45 seconds. FIG. 11(D) shows the harvested PEI-Au nanostructures corresponding to FIG. 11(A) in methanol solution. The upper inset shows a schematic representation of the structure. The lower insert shows a micrograph image. FIG. 11(E) shows the harvested PEI-Au nanostructures corresponding to FIG. 11(B) in methanol solution. The upper inset shows a schematic representation of the structure. The lower insert shows a micrograph image. FIG. 11(F) shows the harvested PEI-Au nanostructures corresponding to FIG. 11(C) in methanol solution. The upper inset shows a schematic representation of the structure. The lower insert shows a micrograph image.

The exfoliation procedure employed to obtain the nanosheets is straightforward and cost-effective. The Au-PEI nanocomposite supported on glass was ultrasonicated in methanol for 30 min at 30 W then dispersed in water. A colored colloidal suspension was observed (the insets in FIGS. 10(C) and 10(D)). The stability of the nanosheets colloidal solution was evaluated using zeta potential measurements (FIG. 10(E)). The high zeta potential values observed (positive 48 mV to positive 50 mV) showed increased stability at high PEI molecular weights (>20 kDa), suggesting that the Au nanodomains are encapsulated by PEI and that the cationic charge density of PEI keeps the nanosheets apart.

To study the microstructural morphology of the exfoliated nanosheets, the nanosheets suspended in colloidal solutions were deposited onto TEM grids. The nanosheets display lateral dimensions of up to several hundreds of nanometers across (FIG. 12). FIG. 12 shows TEM images of the exfoliated nanosheets according to embodiments of the present invention. FIG. 12(A) shows Au-PEI NS I with disconnected labyrinthine-like gold domains. FIG. 12(B) shows Au-PEI NS II with connected labyrinthine-like gold domains. FIG. 12(C) shows NSs made with a lower sonication power. FIG. 12(D) shows NSs made with another lower sonication power. As shown in FIGS. 12(C) and (D), larger lateral dimensions can be obtained by gentle sonication. FIG. 12(E) shows an HRTE image of the NS (the inset shows FFTs) showing the poly-crystalline nature of Au domains. FIG. 12(F) shows another HRTE image of the NS (the inset shows FFTs) showing the polycrystalline nature of Au domains. Through these figures, it was found that the Au-PEI NS I (A) and Au-PEI NS II (B) have a short axis of 5.7+−1.0 nm (interspacing=3.6+−1.0 nm, 47% porosity) and 7.2+−1.2 nm (interspacing=1.8+−0.4 nm, 31% porosity), respectively. If larger lateral dimensions are desired, lower sonication powers (10 W) can be employed (FIGS. 12(C) and 12(D)). Folds at the edges of the large nanosheets can be observed. The HRTEM and associated Fast Fourier Transforms (FFTs) show that the gold domains are poly-crystalline (FIGS. 12(E) and 12(F) and insets), with lattice plane spacing in agreement with those of bulk Au.

The surface topography of the exfoliated Au-PEI NSs was examined by atomic force microscopy (AFM). FIG. 13 shows surface topography and nanomechanical property mapping of the exfoliated nanosheets. FIG. 13(A) shows an AFM height image of Au-PEI NS I featuring areas with single layer and folded double layer. FIG. 13(C) shows a cross section height profile showing a thickness of 5-8 nm of each layer. FIG. 13(B) shows an AFM height image of Au-PEI NS II. FIG. 13(D) shows a cross section height profile showing a thickness of 7-10 nm. FIG. 13(E) shows a DMT modulus map of Au-PEI NS I. FIG. 13(F) shows a DMT modulus map of Au-PEI NS II. FIG. 13(G) shows the corresponding modulus histogram for FIG. 13(E). FIG. 13(H) shows the corresponding modulus histogram for FIG. 13(F).

The nanosheets were ultrathin and flat, having a uniform monolayer height of 5 to 8 nm for Au-PEI NS I (FIGS. 13(A) and 13(C)) and 7~10 nm for Au-PEI NS II (FIGS. 13(B) and 13(D)). The Derjaguin-Muller-Toporov (DMT) modulus maps (FIGS. 13(E) and 13(G)) show that the Au domains cannot be distinguished from the surrounding polymer and the moduli of the exfoliated nanosheet were homogeneous across the surface, with values of E=5 to 10 MPa for Au-PEI NS I (FIGS. 13(F) and E=30 to 40 MPa for Au-PEI NS II (FIG. 13(H)). These homogeneous modulus values suggest again that the Au domains are fully encapsulated by PEI. This was further confirmed by the elemental mapping and spectrum of a nanosheet region recorded in high-angle annular dark-field scanning TEM (HAADF STEM) mode, shown in FIG. 14, which qualitatively correlates the distribution of Au and C with the microstructure.

The optical absorption properties of the exfoliated Au-PEI NSs were measured using UV-Vis spectroscopy. The absorption characteristics are highly sensitive to the density of Au domains (controlled by Au deposition time). The optical absorption spectra from the exfoliated Au-PEI NS I and Au-PEI NS II are shown in FIG. 15, as compared to isolated NPs. FIG. 15 is a UV-Vis absorption spectra of the exfoliated nanosheet suspensions in water. Au-PEI NS I is indicated by a solid curve having about 0.5 absorption at 1000 nm and Au-PEI NS II is indicated by a solid line having about 0.7 absorption at 1000 nm. PEI-AuNPs, which were prepared at t=15 seconds, are shown in the dashed line for comparison.

As shown in these figures, a red shift and an increase in the optical density is observed upon increasing the Au domains density. The spectra exhibit an absorption minimum around 500 nm, and a pronounced absorption band extending into the near infrared region that can be attributed to longitudinal surface plasmon resonance (LSPR) (LPT No. 43).

A novel green synthesis method to prepare 2D PEI-Au nanosheets with labyrinthine-like polycrystalline Au domains was presented. The nanosheets are flexible, transferable with tunable size and plasmonic activity. Both free standing and stable colloidal solutions of the nanosheets can be obtained which makes them attractive candidates for use in biomedical and nanotechnology contexts, from basic scientific research to commercially useful technologies. The present disclosure focused only on Au and PEI, however the presented method is applicable to other plasmonic metals and branched polymers, extending their capabilities, and providing an opportunity for studies of new functional nanomaterials.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

The invention claimed is:

1. A method for making pH responsive two-dimensional nano-sheets, comprising:
    forming a polyethyleneimine (PEI) matrix on a substrate;
    depositing gold on the PEI matrix until a percolating gold film is formed thereon; and
    dipping the PEI matrix with the percolating gold film into a solution to exfoliate the PEI matrix with the gold into a plurality of two-dimensional sheets, separated from the substrate, the resulting sheets being foldable in response to a pH value surrounding thereto.

2. The method according to claim 1, further comprising: purifying and resuspending the plurality of sheets in deionized water.

3. The method according to claim 1, wherein the solution is a methanol solution.

4. The method according to claim 1, wherein the step of dipping includes applying ultra-sonication to the PEI matrix with the percolating gold film in order to exfoliate into the plurality of two-dimensional sheets.

5. The method according to claim 1, wherein the substrate is a silicon wafer.

6. The method according to claim 1, wherein the step of depositing the gold on the PEI matrix includes sputtering the gold onto the PEI matrix on the substrate until the percolating gold film is formed thereon.

* * * * *

UNITED STATES PATENT AND TRADEMARK OFFICE
CERTIFICATE OF CORRECTION

PATENT NO. : 10,279,540 B2  
APPLICATION NO. : 15/120399  
DATED : May 7, 2019  
INVENTOR(S) : Jeong-Hwan Kim et al.

Page 1 of 1

It is certified that error appears in the above-identified patent and that said Letters Patent is hereby corrected as shown below:

On the Title Page

Item (73); Change:
(73) Assignees: OKINAWA INSTITUTE OF SCIENCE AND TECNOLOGY SCHOO, Okinawa (JP)

To be:
(73) Assignees: OKINAWA INSTITUTE OF SCIENCE AND TECHNOLOGY SCHOOL CORPORATION, Okinawa (JP)

Signed and Sealed this  
Tenth Day of September, 2019

Andrei Iancu  
*Director of the United States Patent and Trademark Office*